United States Patent
Honma

(10) Patent No.: US 12,198,779 B2
(45) Date of Patent: Jan. 14, 2025

(54) NON-VOLATILE MEMORY AND MEMORY SYSTEM

(71) Applicant: Kioxia Corporation, Tokyo (JP)

(72) Inventor: Mitsuaki Honma, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/447,108

(22) Filed: Aug. 9, 2023

(65) Prior Publication Data

US 2024/0274219 A1 Aug. 15, 2024

(30) Foreign Application Priority Data

Feb. 16, 2023 (JP) .................................. 2023-022673

(51) Int. Cl.
*G11C 29/00* (2006.01)
*G11C 7/10* (2006.01)
*G11C 29/52* (2006.01)

(52) U.S. Cl.
CPC ............ *G11C 29/52* (2013.01); *G11C 7/1066* (2013.01); *G11C 7/1069* (2013.01)

(58) Field of Classification Search
CPC ..... G11C 29/52; G11C 29/021; G11C 7/1006; G11C 7/066; G11C 7/1039; G11C 7/1069
See application file for complete search history.

(56) References Cited

U.S. PATENT DOCUMENTS

| | | | |
|---|---|---|---|
| 10,474,525 B2 | 11/2019 | Sharon et al. | |
| 10,733,047 B2 * | 8/2020 | El Gamal | G11C 16/26 |
| 11,456,758 B1 * | 9/2022 | Zamir | H03M 7/3059 |
| 11,620,050 B2 * | 4/2023 | Sravan | G06F 3/0679 |
| | | | 711/154 |
| 11,894,068 B2 * | 2/2024 | Hsu | G11C 16/0483 |
| 11,907,545 B2 * | 2/2024 | Li | G06F 3/0658 |
| 12,057,188 B2 * | 8/2024 | Bassa | G11C 7/1039 |
| 2017/0046220 A1 | 2/2017 | Sharon et al. | |
| 2022/0116053 A1 | 4/2022 | Zamir et al. | |
| 2022/0129163 A1 | 4/2022 | Sravan et al. | |
| 2023/0170004 A1 | 6/2023 | Azuma et al. | |

FOREIGN PATENT DOCUMENTS

JP 2023078545 A 6/2023

* cited by examiner

*Primary Examiner* — Esaw T Abraham

(74) *Attorney, Agent, or Firm* — Holtz, Holtz & Volek PC

(57) ABSTRACT

A memory system includes a plurality of memory cells each storing a first bit and a second bit and a control circuit. The control circuit is reads out first data, first partial data, and second partial data, each corresponding to the first bit, from the plurality of memory cells, read out second data, third partial data, and fourth partial data, each corresponding to the second bit, from the plurality of memory cells, generate first compressed data based on an OR operation of the first partial data and the third partial data, generate second compressed data based on an OR operation of the second partial data and the fourth partial data, and transmit the first data, the second data, the first compressed data, and the second compressed data to an external memory controller.

20 Claims, 19 Drawing Sheets

| | S0 | | | S1 | | | S2 | | | S3 | | | S4 | | | S5 | | | S6 | | | S7 | | operation |
|---|---|---|---|---|---|---|---|---|---|---|---|---|---|---|---|---|---|---|---|---|---|---|---|---|
| | S0⁻ | S0⁺ | S0⁰ | S1⁻ | S1⁺ | S1⁰ | S2⁻ | S2⁺ | S2⁰ | S3⁻ | S3⁺ | S3⁰ | S4⁻ | S4⁺ | S4⁰ | S5⁻ | S5⁺ | S5⁰ | S6⁻ | S6⁺ | S6⁰ | S7⁻ | S7⁺ | S7⁰ | |
| SEN | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | sense(R6) |
| SDL | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | SDL=SEN |
| CDL | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | CDL=~SDL |
| SEN | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | sense(R6⁻) |
| ADL | 0 | 0 | 0 | 0 | 0 | 0 | 0 | 0 | 0 | 0 | 0 | 0 | 1 | 1 | 1 | 1 | 1 | 1 | 0 | 0 | 0 | 0 | 0 | 0 | ADL=SEN&~SDL \| ADL |
| SEN | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | sense(R6⁺) |
| BDL | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | BDL=~SEN&SDL \| BDL |
| SEN | 0 | 0 | 0 | 0 | 0 | 0 | 0 | 0 | 0 | 1 | 1 | 1 | 1 | 1 | 1 | 0 | 0 | 0 | 0 | 0 | 0 | 1 | 1 | 1 | sense(R4) |
| SDL | 0 | 0 | 0 | 0 | 0 | 0 | 0 | 0 | 0 | 1 | 1 | 1 | 1 | 1 | 1 | 0 | 0 | 0 | 0 | 0 | 0 | 1 | 1 | 1 | SDL=SEN |
| CDL | 1 | 1 | 1 | 1 | 1 | 1 | 1 | 1 | 1 | 0 | 0 | 0 | 0 | 0 | 0 | 1 | 1 | 1 | 0 | 0 | 0 | 0 | 0 | 0 | CDL=SDL&CDL |
| SEN | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 | 1 | sense(R4⁻) |
| ADL | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | ADL=SEN&~SDL \| ADL |
| SEN | 0 | 0 | 0 | 1 | 1 | 1 | 1 | 1 | 1 | 0 | 0 | 0 | 0 | 0 | 0 | 1 | 1 | 1 | 1 | 1 | 1 | 0 | 0 | 0 | sense(R4⁺) |
| BDL | 1 | 1 | 1 | 1 | 1 | 1 | 1 | 1 | 1 | 0 | 0 | 0 | 0 | 0 | 0 | 1 | 1 | 1 | 0 | 0 | 0 | 0 | 0 | 0 | BDL=~SEN&SDL \| BDL |
| SEN | 0 | 0 | 0 | 0 | 0 | 0 | 0 | 0 | 0 | 1 | 1 | 1 | 1 | 1 | 1 | 1 | 1 | 1 | 0 | 0 | 0 | 1 | 1 | 1 | sense(R2) |
| SDL | 0 | 0 | 0 | 0 | 0 | 0 | 0 | 0 | 0 | 1 | 1 | 1 | 1 | 1 | 1 | 1 | 1 | 1 | 0 | 0 | 0 | 1 | 1 | 1 | SDL=SEN |
| CDL | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | CDL=~SDL&CDL |
| SEN | 0 | 0 | 0 | 0 | 0 | 0 | 1 | 1 | 1 | 1 | 1 | 1 | 1 | 1 | 1 | 0 | 0 | 0 | 1 | 1 | 1 | 0 | 0 | 0 | sense(R2⁻) |
| ADL | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | ADL=SEN&~SDL \| ADL |
| SEN | 0 | 0 | 0 | 1 | 1 | 1 | 1 | 1 | 1 | 0 | 0 | 0 | 1 | 1 | 1 | 0 | 0 | 0 | 0 | 0 | 0 | 0 | 0 | 0 | sense(R2⁺) |
| BDL | 1 | 1 | 1 | 1 | 1 | 1 | 1 | 1 | 1 | 0 | 0 | 0 | 1 | 1 | 1 | 1 | 1 | 1 | 0 | 0 | 0 | 0 | 0 | 0 | BDL=~SEN&SDL \| BDL |
| XDL | 1 | 1 | 1 | 1 | 1 | 1 | 1 | 1 | 1 | 0 | 0 | 0 | 1 | 1 | 1 | 1 | 1 | 1 | 0 | 0 | 0 | 0 | 0 | 0 | XDL=CDL |

↳ Output as HB_M
↑ Maintain for generating SB⁻OR and SB⁺OR

| | S0 | | | | S1 | | | | S2 | | | | S3 | | | | S4 | | | | S5 | | | | S6 | | | | S7 | | | | operation |
|---|---|---|---|---|---|---|---|---|---|---|---|---|---|---|---|---|---|---|---|---|---|---|---|---|---|---|---|---|---|---|---|---|
| | $S0^0$ | $S0^+$ | | | $S1^-$ | $S1^0$ | $S1^+$ | | $S2^-$ | $S2^0$ | $S2^+$ | | $S3^-$ | $S3^0$ | $S3^+$ | | $S4^-$ | $S4^0$ | $S4^+$ | | $S5^-$ | $S5^0$ | $S5^+$ | | $S6^-$ | $S6^0$ | $S6^+$ | | $S7^-$ | $S7^0$ | | |
| SEN | 0 | 0 | | | 0 | 0 | 0 | | 0 | 0 | 0 | | 0 | 0 | 0 | | 1 | 1 | 1 | | 1 | 1 | 1 | | 1 | 1 | 1 | | 1 | 1 | | sense(R4) |
| SDL | 0 | 0 | | | 0 | 0 | 0 | | 0 | 0 | 0 | | 0 | 0 | 0 | | 1 | 1 | 1 | | 1 | 1 | 1 | | 1 | 1 | 1 | | 1 | 1 | | SDL=SEN |
| TDL | 0 | 0 | | | 0 | 0 | 0 | | 0 | 0 | 0 | | 0 | 0 | 0 | | 1 | 1 | 1 | | 1 | 1 | 1 | | 1 | 1 | 1 | | 1 | 1 | | TDL=SDL&TDL |
| SEN | 0 | 0 | | | 0 | 0 | 0 | | 0 | 0 | 0 | | 1 | 1 | 1 | | 1 | 1 | 1 | | 1 | 1 | 1 | | 0 | 0 | 0 | | 0 | 0 | | sense(R4⁻) |
| ADL | 0 | 0 | | | 0 | 0 | 0 | | 0 | 0 | 0 | | 1 | 1 | 1 | | 0 | 0 | 0 | | 0 | 0 | 0 | | 0 | 0 | 0 | | 0 | 0 | | ADL=SEN&~SDL \| ADL |
| SEN | 0 | 0 | | | 0 | 0 | 0 | | 0 | 0 | 0 | | 0 | 0 | 0 | | 1 | 1 | 1 | | 1 | 1 | 1 | | 1 | 1 | 1 | | 1 | 1 | | sense(R4⁺) |
| BDL | 0 | 0 | | | 0 | 0 | 0 | | 0 | 0 | 0 | | 0 | 0 | 0 | | 1 | 1 | 1 | | 0 | 0 | 0 | | 0 | 0 | 0 | | 0 | 0 | | BDL=~SEN&SDL \| BDL |
| SEN | 0 | 0 | | | 0 | 0 | 0 | | 1 | 1 | 1 | | 1 | 1 | 1 | | 1 | 1 | 1 | | 1 | 1 | 1 | | 1 | 1 | 1 | | 1 | 1 | | sense(R3) |
| SDL | 0 | 0 | | | 0 | 0 | 0 | | 1 | 1 | 1 | | 1 | 1 | 1 | | 1 | 1 | 1 | | 1 | 1 | 1 | | 1 | 1 | 1 | | 1 | 1 | | SDL=SEN |
| XDL | 1 | 1 | | | 1 | 1 | 1 | | 1 | 1 | 0 | | 0 | 0 | 0 | | 0 | 0 | 0 | | 0 | 0 | 0 | | 0 | 0 | 0 | | 1 | 1 | | XDL=~SDL \| XDL |
| SEN | 0 | 0 | | | 0 | 0 | 0 | | 0 | 0 | 0 | | 1 | 1 | 1 | | 1 | 1 | 1 | | 1 | 1 | 1 | | 1 | 1 | 1 | | 1 | 1 | | sense(R3⁻) |
| ADL | 0 | 0 | | | 0 | 0 | 0 | | 0 | 0 | 0 | | 1 | 1 | 1 | | 0 | 0 | 0 | | 0 | 0 | 0 | | 0 | 0 | 0 | | 0 | 0 | | ADL=SEN&~SDL \| ADL |
| SEN | 0 | 0 | | | 0 | 0 | 0 | | 0 | 0 | 1 | | 1 | 1 | 1 | | 1 | 1 | 1 | | 1 | 1 | 1 | | 1 | 1 | 1 | | 1 | 1 | | sense(R3⁺) |
| BDL | 0 | 0 | | | 0 | 0 | 0 | | 0 | 0 | 1 | | 0 | 0 | 0 | | 0 | 0 | 0 | | 0 | 0 | 0 | | 0 | 0 | 0 | | 0 | 0 | | BDL=~SEN&SDL \| BDL |

(A) → S4

→ Maintain for generating SB⁻OR and SB⁺OR
→ Output as HB_U

| | S0 | | S1 | | S2 | | S3 | | S4 | | S5 | | S6 | | S7 | | operation |
|---|---|---|---|---|---|---|---|---|---|---|---|---|---|---|---|---|---|
| | S0⁰ | S0⁺ | S1⁰ | S1⁺ | S2⁻ | S2⁰ | S2⁺ | S3⁻ | S3⁰ | S3⁺ | S4⁻ | S4⁰ | S4⁺ | S5⁻ | S5⁰ | S5⁺ | S6⁻ | S6⁰ | S6⁺ | S7⁻ | S7⁰ | |
| SEN | 0 | 0 | 0 | 0 | 0 | 1 | 1 | 1 | 1 | 1 | 1 | 1 | 1 | 1 | 1 | 1 | 1 | 1 | 1 | 1 | 1 | sense(R2⁻) |
| SDL | 0 | 0 | 0 | 0 | 0 | 1 | 1 | 1 | 1 | 1 | 1 | 1 | 1 | 1 | 1 | 1 | 1 | 1 | 1 | 1 | 1 | SDL=SEN |
| TDL | 1 | 1 | 1 | 1 | 1 | 0 | 0 | 0 | 0 | 0 | 0 | 0 | 0 | 0 | 0 | 0 | 0 | 0 | 0 | 0 | 0 | TDL=~SDL\|TDL |
| SEN | 0 | 0 | 0 | 0 | 0 | 0 | 1 | 1 | 1 | 1 | 1 | 1 | 1 | 1 | 1 | 1 | 1 | 1 | 1 | 1 | 1 | sense(R2⁻) |
| ADL | 0 | 0 | 0 | 0 | 0 | 0 | 1 | 1 | 1 | 1 | 1 | 1 | 1 | 1 | 1 | 1 | 1 | 1 | 1 | 1 | 1 | ADL=SEN&~SDL\|ADL |
| SEN | 0 | 0 | 0 | 0 | 0 | 0 | 0 | 0 | 0 | 0 | 1 | 1 | 1 | 1 | 1 | 1 | 1 | 1 | 1 | 1 | 1 | sense(R2⁺) |
| BDL | 0 | 0 | 0 | 0 | 0 | 0 | 0 | 0 | 0 | 0 | 1 | 1 | 1 | 1 | 1 | 1 | 1 | 1 | 1 | 1 | 1 | BDL=~SEN&SDL\|BDL |
| XDL | 1 | 1 | 1 | 1 | 1 | 0 | 0 | 0 | 0 | 0 | 0 | 0 | 0 | 0 | 0 | 0 | 0 | 0 | 0 | 0 | 0 | XDL=TDL |

→ Output as HB_M

↑↑ Maintain for generating SB⁻OR and SB⁺OR

NON-VOLATILE MEMORY AND MEMORY SYSTEM

CROSS-REFERENCE TO RELATED APPLICATION (S)

This application is based upon and claims the benefit of priority from Japanese Patent Application No. 2023-022673, filed Feb. 16, 2023, the entire contents of which are incorporated herein by reference.

FIELD

Embodiments described herein relate generally to a non-volatile memory and a memory system.

BACKGROUND

There is known a memory system including a NAND flash memory as a non-volatile memory, and a memory controller that controls the non-volatile memory. The memory controller has a function of correcting an error included in data read out from the non-volatile memory.

BRIEF DESCRIPTION OF THE DRAWINGS

FIGS. 13 to 15 are views showing examples of an operation process in the non-volatile memory according to the first embodiment.

FIGS. 17 to 20 are views showing examples of an operation process in a non-volatile memory according to the second embodiment.

DETAILED DESCRIPTION

A non-volatile memory includes a plurality of memory cells each configured to store a first bit and a second bit and a control circuit. The control circuit is configured to read out first hard bit data, first partial soft bit data, and second partial soft bit data, each corresponding to the first bit, from the plurality of memory cells, read out second hard bit data, third partial soft bit data, and fourth partial soft bit data, each corresponding to the second bit, from the plurality of memory cells, generate first compressed soft bit data based on an OR operation of the first partial soft bit data and the third partial soft bit data, generate second compressed soft bit data based on an OR operation of the second partial soft bit data and the fourth partial soft bit data, and transmit the first hard bit data, the second hard bit data, the first compressed soft bit data, and the second compressed soft bit data to an external memory controller.

Hereinafter, embodiments will be described with reference to the accompanying drawings. In the description that follows, components having an approximately identical function and configuration will be assigned an identical symbol. A numeral that follows letters constituting a reference symbol is used to distinguish between components referred to by reference symbols including the same letters and having a similar configuration. If components represented by reference symbols including the same letters need not be distinguished from each other, such components are referred to by reference symbols including only the same letters.

1. First Embodiment

1.1 Arrangement

1.1.1 Information Processing System

The configuration of an information processing system according to the first embodiment will be described.

Figure 1:
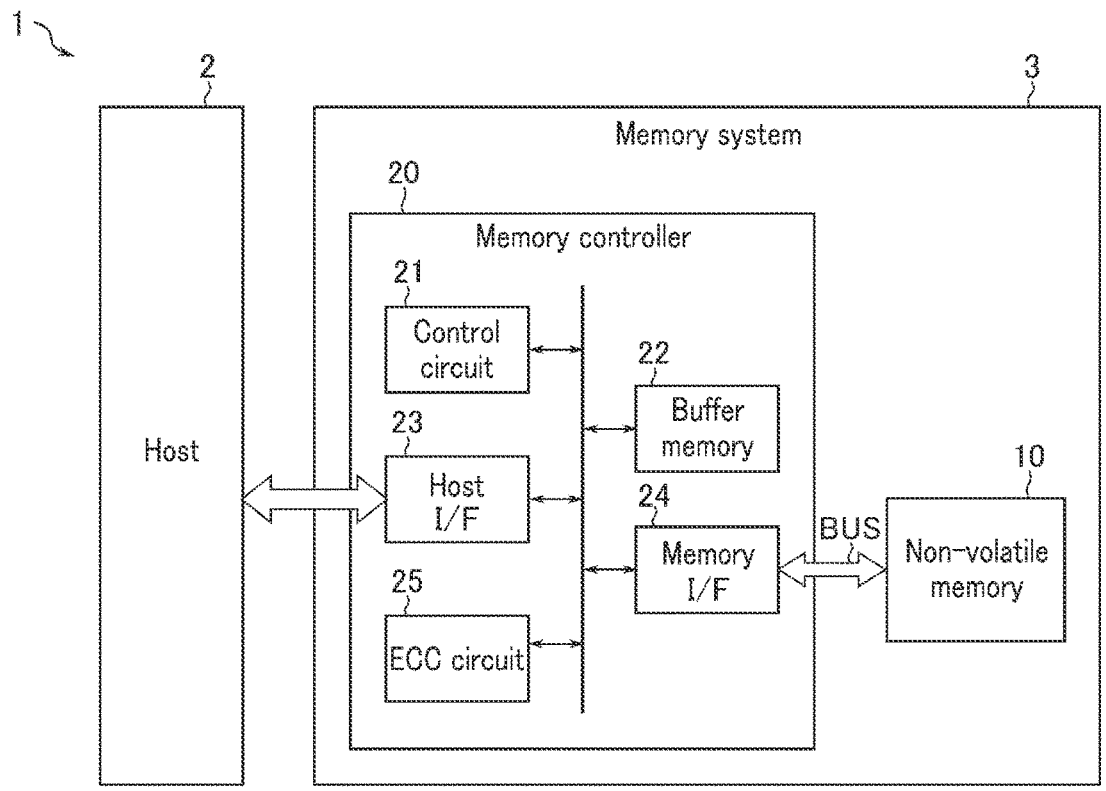
FIG. 1 is a block diagram showing an example of the configuration of an information processing system according to the first embodiment.

FIG. 1 is a block diagram showing an example of the configuration of the information processing system according to the first embodiment. As shown in FIG. 1, an information processing system 1 includes a host 2 and a memory system 3.

The host 2 is a data processing apparatus that processes data using the memory system 3. The host 2 is, for example, a personal computer or a server in a data center.

The memory system 3 is a storage apparatus configured to be connected to the host 2. The memory system 3 is, for example, a memory card such as an SD™ card, a UFS (Universal Flash Storage), or an SSD (Solid State Drive). The memory system 3 executes a data write process, a data read process, or a data erase process in accordance with a request from the host 2. The memory system 3 may execute the write process, the read process, and the erase process as internal processes. The internal process is a process executed within the memory system 3 without a request from the host 2.

1.1.2 Memory System

The internal arrangement of the memory system according to the first embodiment will be described.

The memory system 3 includes a non-volatile memory 10 and a memory controller 20.

The non-volatile memory 10 is, for example, a NAND flash memory. The non-volatile memory 10 nonvolatilely stores data.

The memory controller 20 is formed from, for example, an integrated circuit such as an SoC (System-on-a-Chip). The memory controller 20 controls the non-volatile memory 10 based on a request from the host 2.

More specifically, for example, the memory controller 20 writes write data in the non-volatile memory 10 based on a write request from the host 2. Further, the memory controller 20 reads out read data from the non-volatile memory 10 based on a read request from the host 2. Then, the memory controller 20 transmits data based on the read data to the host 2.

1.1.3 Memory Controller

Continuing reference to FIG. 1, the internal arrangement of the memory controller 20 will be described next. The memory controller 20 includes a control circuit 21, a buffer memory 22, a host interface circuit 23 (host I/F), a memory interface circuit 24 (memory I/F), and an ECC circuit 25. The function of the memory controller 20 to be described below can be implemented by a hardware component or a combination of a hardware resource and firmware.

The control circuit 21 is a circuit that controls the entire memory controller 20. The control circuit 21 includes, for example, a processor such as a CPU (Central Processing Unit) and a ROM (Read Only Memory).

The buffer memory 22 is, for example, an SRAM (Static Random Access Memory). The buffer memory 22 buffers data between the host 2 and the non-volatile memory 10. For example, the buffer memory 22 temporarily stores write data and read data.

The host interface circuit 23 controls communication between the memory controller 20 and the host 2. The host interface circuit 23 is connected to the host 2 via a host bus. The host bus is a bus complying with, for example, the SD™ interface, SAS (Serial Attached SCSI (Small Computer System Interface)), SATA (Serial ATA (Advanced Technology Attachment)), or PCIe™ (Peripheral Component Interconnect express).

The memory interface circuit 24 controls communication between the non-volatile memory 10 and the memory controller 20. The memory interface circuit 24 is connected to the non-volatile memory 10 via a memory bus BUS. The memory bus BUS is a bus complying with, for example, the SDR (Single Data Rate) interface, the toggle DDR (Double Data Rate) interface, or the ONFI (Open NAND Flash Interface).

The ECC circuit 25 performs an error detection process and an error correction process for data to be stored in the non-volatile memory 10. That is, during the data write process, the ECC circuit 25 gives an error correction code to the write data. Examples of the encoding method are a BCH (Bose-Chaudhuri-Hocquenghem) code, an RS (Reed-Solomon) code, and an LDPC (Low-Density Parity-Check) code. During the data read process, the ECC circuit 25 decodes read data, and detects the presence/absence of an error bit. If an error bit is detected, the ECC circuit 25 specifies the column address (error position) of the error bit, and corrects the error. The arrangement of the ECC circuit 25 will be described later.

1.1.4 Non-Volatile Memory

Figure 2:
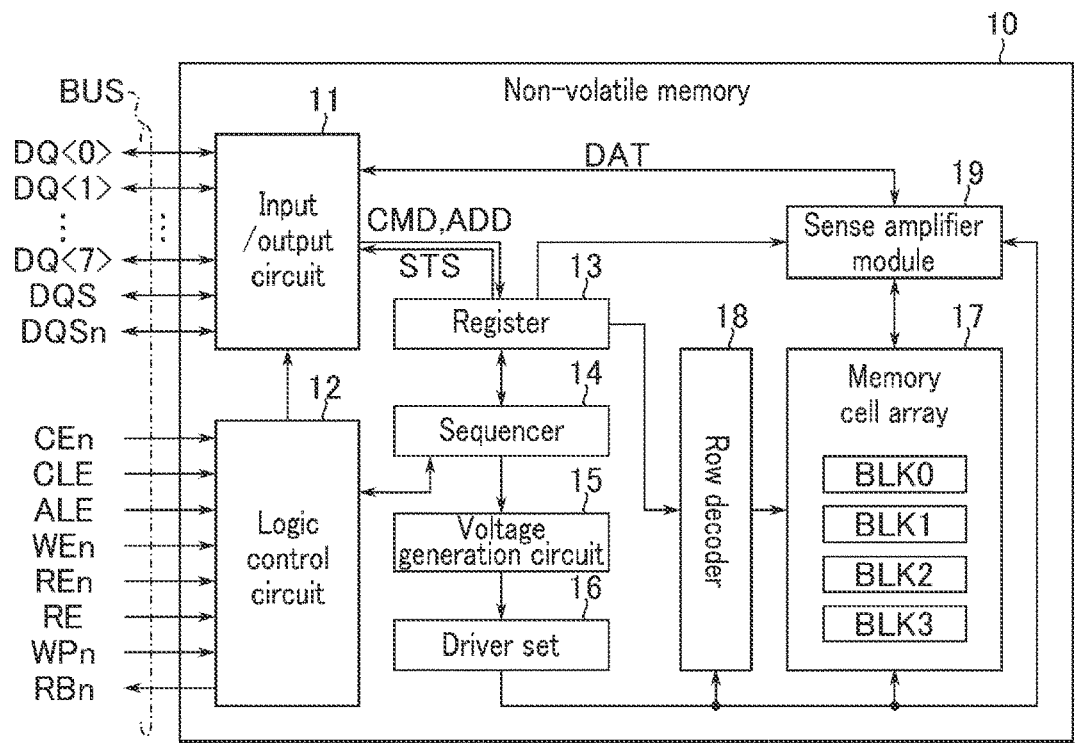
FIG. 2 is a block diagram showing an example of the arrangement of a non-volatile memory according to the first embodiment.

Next, the internal arrangement of the non-volatile memory according to the first embodiment will be described. FIG. 2 is a block diagram showing an example of the arrangement of the non-volatile memory according to the first embodiment.

The non-volatile memory 10 includes an input/output circuit 11, a logic control circuit 12, a register 13, a sequencer 14, a voltage generation circuit 15, a driver set 16, a memory cell array 17, a row decoder 18, and a sense amplifier module 19.

The input/output circuit 11 and the logic control circuit 12 transmit/receive various kinds of signals to/from the memory controller 20 via the memory bus BUS. Signals transmitted/received by the input/output circuit 11 include, for example, signals DQ<0>, DQ<1>, . . . , and DQ<7> (signals DQ<7:0>), and signals DQS and DQSn. Signals transmitted/received by the logic control circuit 12 include, for example, signals CEn, CLE, ALE, WEn, RE, REn, WPn, and RBn. In this specification, n at the end of the signal name means that the signal is asserted if the signal is at "L (Low)" level.

Each of the signals DQ<7:0> is an 8-bit signal. Each of the signals DQ<7:0> is the entity of data DAT transmitted/received between the non-volatile memory 10 and the memory controller 20. In the following description, the signals DQ<7:0> transmitted from the memory controller 20 to the non-volatile memory 10 are referred to as the input signals DQ<7:0>. The signals DQ<7:0> transmitted from the non-volatile memory 10 to the memory controller 20 are referred to as the output signals DQ<7:0>. Each of the input signals DQ<7:0> includes, for example, the write data DAT, an address ADD, and a command CMD. Each of the output signals DQ<7:0> includes, for example, the read data DAT and a status STS.

The signals DQS and DQSn are strobe signals. The signal DQSn is an inverted signal of the signal DQS.

The signal CEn is a signal for enabling the non-volatile memory 10.

The signals CLE and ALE are signals for notifying the non-volatile memory 10 that the input signals DQ<7:0> are the commands CMD and the addresses ADD, respectively.

The signal WEn is a signal for causing the non-volatile memory 10 to capture the input signals DQ<7:0>.

The signals RE and REn are signals for reading out the output signals DQ<7:0> from the non-volatile memory 10.

The signal WPn is a signal for instructing the non-volatile memory 10 to prohibit the write process and the erase operation.

The signal RBn is a signal indicating whether the non-volatile memory 10 is in the ready state or the busy state. The ready state is a state in which the non-volatile memory 10 can receive an instruction from the memory controller 20. The busy state is a state in which the non-volatile memory 10 cannot receive an instruction from the memory controller 20. When the signal RBn is at "L" level, it indicates the busy state.

The input/output circuit 11 transmits the address ADD and the command CMD in each of the input signals DQ<7:0> to the register 13, and transmits the write data DAT therein to the sense amplifier module 19. The input/output circuit 11 receives the status STS in each of the output signals DQ<7:0> from the register 13, and receives the read data DAT therein from the sense amplifier module 19.

The logic control circuit 12 receives, from the memory controller 20, the signals CEn, CLE, ALE, WEn, RE, REn, and WPn. The logic control circuit 12 transmits the signal RBn to the memory controller 20.

The register 13 stores the address ADD, the command CMD, and the status STS. The address ADD includes, for example, a column address, a block address, and a page address.

The sequencer 14 controls the operation of the entire non-volatile memory 10 based on the command CMD stored in the register 13.

The voltage generation circuit 15 generates voltages to be used in the write process, the read process, the erase operation, and the like.

The drive set 16 supplies the voltage generated by the voltage generation circuit 15 to the memory cell array 17, the row decoder 18, and the sense amplifier module 19.

The memory cell array 17 includes a plurality of blocks BLK, a plurality of bit lines, and a plurality of word lines. The example shown in FIG. 2 shows a case in which the memory cell array 17 includes four blocks BLK0, BLK1, BLK2, and BLK3. The block BLK is, for example, a unit of erasing the data DAT in the erase operation. Each block BLK includes a plurality of memory cell transistors. Each memory cell transistor is associated with a set of the bit line and the word line.

The row decoder 18 selects one of the blocks BLK0 to BLK 3 based on the block address in the register 13. The row decoder 18 further selects the word line in the selected block BLK based on the page address in the register 13.

The sense amplifier module 19 selects the bit line based on the column address in the register 13. In the write process, the sense amplifier module 19 transmits the write data DAT to the memory cell array 17 via the selected bit line. In the read process, the sense amplifier module 19 senses the threshold voltage of the memory cell transistor via the selected bit line. Then, the sense amplifier module 19 generates the read data DAT based on the sense result.

1.1.5 Memory Cell Array

Figure 3:
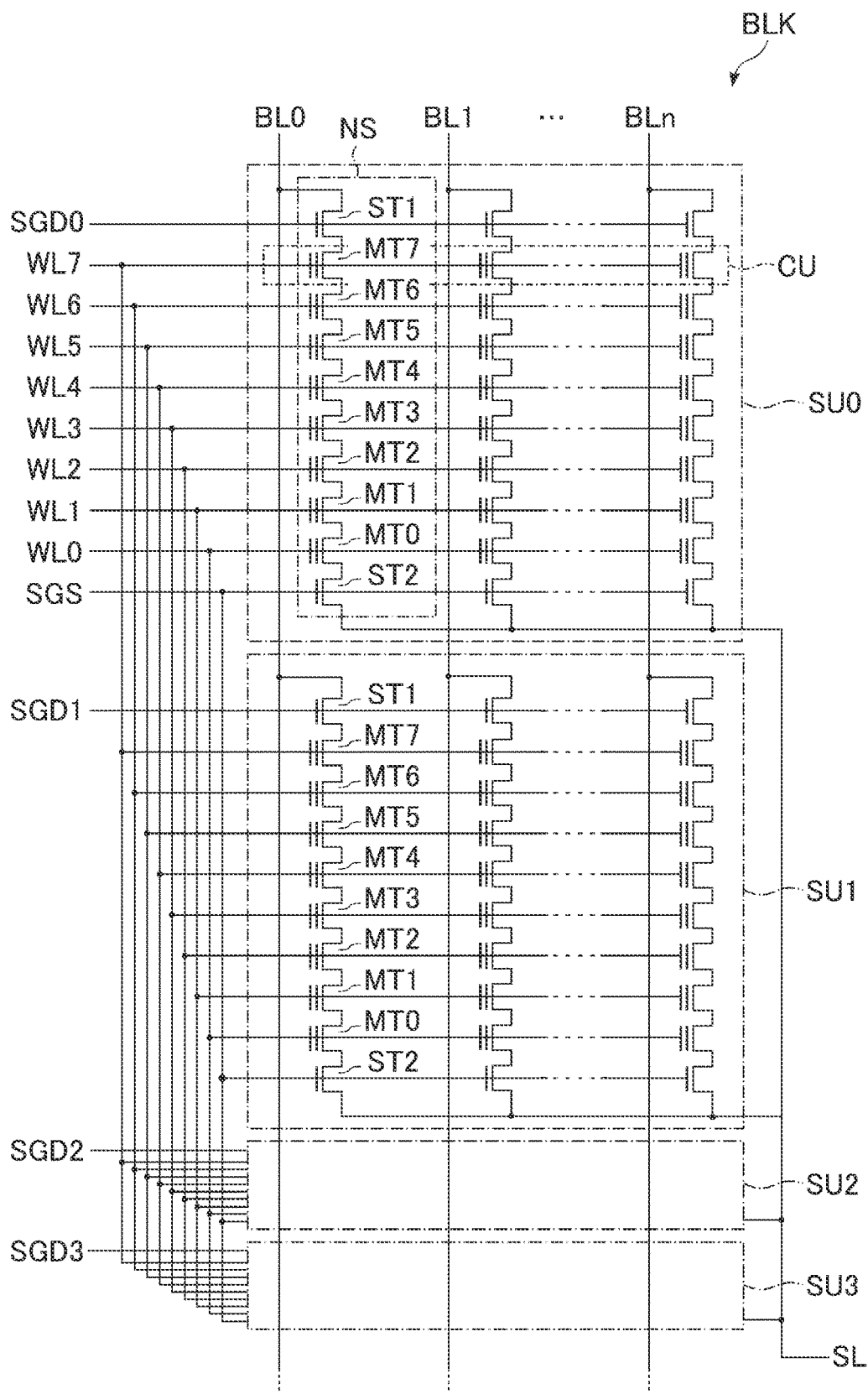
FIG. 3 is a circuit diagram showing an example of the circuit arrangement of a memory cell array according to the first embodiment.

Next, the arrangement of the memory cell array according to the first embodiment will be described. FIG. 3 is a circuit diagram showing an example of the circuit arrangement of the memory cell array according to the first embodiment. FIG. 3 shows one block BLK of the plurality of blocks BLK included in the memory cell array 17. As shown in FIG. 3, the block BLK includes, for example, four string units SU0 to SU3.

Each string unit SU includes a plurality of NAND strings NS associated with bit lines BL0 to BLn (n is an integer of 2 or more), respectively. Each NAND string NS includes, for example, memory cell transistors MT0 to MT7, and selection transistors ST1 and ST2. Each memory cell transistor MT includes a control gate and a charge accumulation layer. Each memory cell transistor MT nonvolatilely stores data. Each of the selection transistors ST1 and ST2 is used to select the string unit SU in various kinds of operations.

In each NAND string NS, the memory cell transistors MT0 to MT7 are connected in series. The drain of the selection transistor ST1 is connected to the associated bit line BL, and the source of the selection transistor ST1 is connected to one end of the serially connected memory cell transistors MT0 to MT7. The drain of the selection transistor ST2 is connected to the other end of the serially connected memory cell transistors MT0 to MT7. The source of the selection transistor ST2 is connected to a source line SL.

In the same block BLK, the control gates of the memory cell transistors MT0 to MT7 are connected to word lines WL0 to WL7, respectively. The gates of the selection transistors ST1 in the string units SU0 to SU3 are connected to selection gate lines SGD0 to SGD3, respectively. The gates of the plurality of selection transistors ST2 are connected to a selection gate line SGS.

Different column addresses are assigned to the bit lines BL0 to BLn. Each bit line BL is shared by the NAND strings NS to which the same column address is assigned among the plurality of blocks BLK. The word lines WL0 to WL7 are provided for each block BLK. The source line SL is shared among, for example, the plurality of blocks BLK.

A set of the plurality of memory cell transistors MT connected to the common word line WL in one string unit SU is referred to as, for example, a cell unit CU. For example, the storage capacity of the cell unit CU including the memory cell transistors MT, each of which stores 1-bit data, is defined as "1-page data". The cell unit CU can have a storage capacity of 2-page data or more in accordance with the number of bits of data stored in the memory cell transistor MT.

Note that the circuit arrangement of the memory cell array 17 included in the non-volatile memory 10 according to the embodiment is not limited to the arrangement described above. For example, the number of the string units SU included in each block BLK can be designed to an arbitrary number. The number of the memory cell transistors MT and the number of the selection transistors ST1 and ST2 included in each NAND string can be designed to arbitrary numbers.

In the following description, a case will be described in which one memory cell transistor MT can store 3-bit data. The write mode to store 3-bit data in the memory cell transistor MT is also called a TLC (Triple Level Cell) mode. The bits of 3-bit data written and stored in the memory cell transistor in the TLC mode are referred to as a lower bit, a middle bit, and an upper bit in the order from the lower bit. A set of the lower bits, a set of the middle bits, and a set of the upper bits stored in the memory cell transistors MT included in the same cell unit CU are referred to as a "lower page", a "middle page", and an "upper page", respectively.

Figure 4:
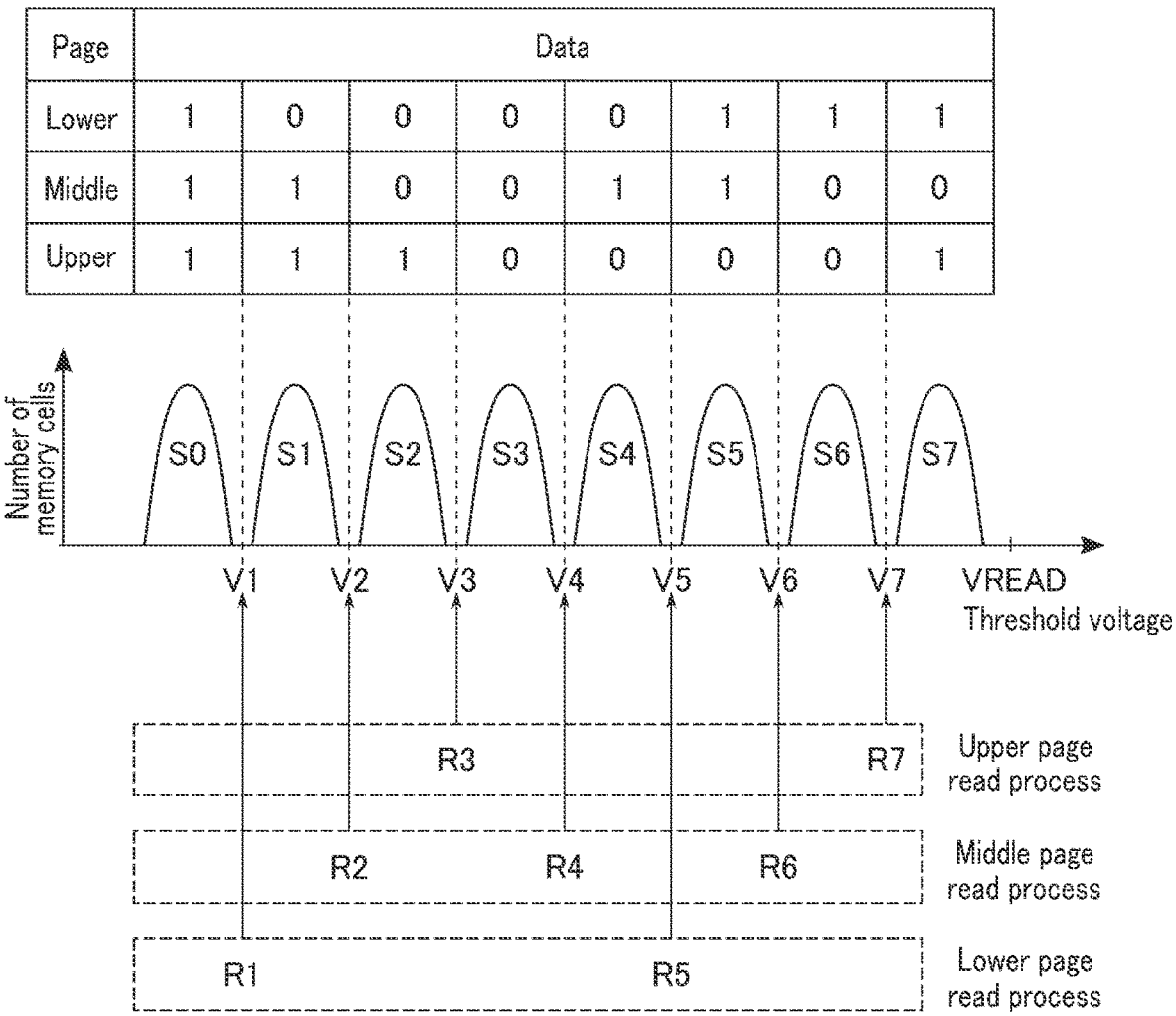
FIG. 4 is a view showing an example of the threshold voltage distributions of a plurality of memory cell transistors and data stored therein according to the first embodiment.

FIG. 4 is a view showing an example of the threshold voltage distributions of the plurality of memory cell transistors and data stored therein according to the first embodiment. In a case in which the memory cell transistor MT stores 3-bit data, the threshold voltage distribution thereof is divided into eight distributions. The eight threshold voltage distributions are referred to as the "S0" state, the "S1" state, the "S2" state, the "S3" state, the "S4" state, the "S5" state, the "S6" state, and the "S7" state in the ascending order of the threshold voltages.

Voltages V1, V2, V3, V4, V5, V6, and V7 shown in FIG. 4 are used to distinguish two adjacent states during the read process. A voltage VREAD is a voltage applied to the unselected word line during the read process. If the voltage VREAD is applied to the gate, the memory cell transistor MT is set in an ON state independently of the stored data. The relationship among these voltage values is expressed as V1<V2<V3<V4<V5<V6<V7<VREAD.

Of the threshold voltage distributions described above, the "S0" state corresponds to the erase state of the memory cell transistor MT. The threshold voltage in the "S0" state is lower than the voltage V1. The threshold voltage in the "S1" state is the voltage V1 or higher and lower than the voltage V2. The threshold voltage in the "S2" state is the voltage V2 or higher and lower than the voltage V3. The threshold voltage in the "S3" state is the voltage V3 or higher and lower than the voltage V4. The threshold voltage in the "S4"

state is the voltage V4 or higher and lower than the voltage V5. The threshold voltage in the "S5" state is the voltage V5 or higher and lower than the voltage V6. The threshold voltage in the "S6" state is the voltage V6 or higher and lower than the voltage V7. The threshold voltage in the "S7" state is the voltage V7 or higher and lower than the voltage VREAD.

The above-described eight threshold voltage distributions are formed by writing 3-bit (3-page) data including the lower bit, the middle bit, and the upper bit. The eight threshold voltage distributions correspond to 3-bit data different from each other. In the following description, for the memory cell transistor MT included in each state, data is assigned to the "upper bit/middle bit/lower bit" as described below.

The memory cell transistor MT included in the "S0" state stores "111" data. The memory cell transistor MT included in the "S1" state stores "011" data. The memory cell transistor MT included in the "S2" state stores "001" data. The memory cell transistor MT included in the "S3" state stores "000" data. The memory cell transistor MT included in the "S4" state stores "010" data. The memory cell transistor MT included in the "S5" state stores "110" data. The memory cell transistor MT included in the "S6" state stores "100" data. The memory cell transistor MT included in the "S7" state stores "101" data. Note that data assignment (coding) described above is an example, and another coding may be applied.

The lower page read process includes read processes R1 and R5. In the read process R1, the voltage V1 which distinguishes the "S0" state and the "S1" state is used as the read voltage. In the read process R5, the voltage V5 which distinguishes the "S4" state and the "S5" state is used as the read voltage.

The middle page read process includes read processes R2, R4, and R6. In the read process R2, the voltage V2 which distinguishes the "S1" state and the "S2" state is used as the read voltage. In the read process R4, the voltage V4 which distinguishes the "S3" state and the "S4" state is used as the read voltage. In the read process R6, the voltage V6 which distinguishes the "S5" state and the "S6" state is used as the read voltage.

The upper page read process includes read processes R3 and R7. In the read process R3, the voltage V3 which distinguishes the "S2" state and the "S3" state is used as the read voltage. In the read process R7, the voltage V7 which distinguishes the "S6" state and the "S7" state is used as the read voltage.

1.1.6 Sense Amplifier Module

Figure 5:
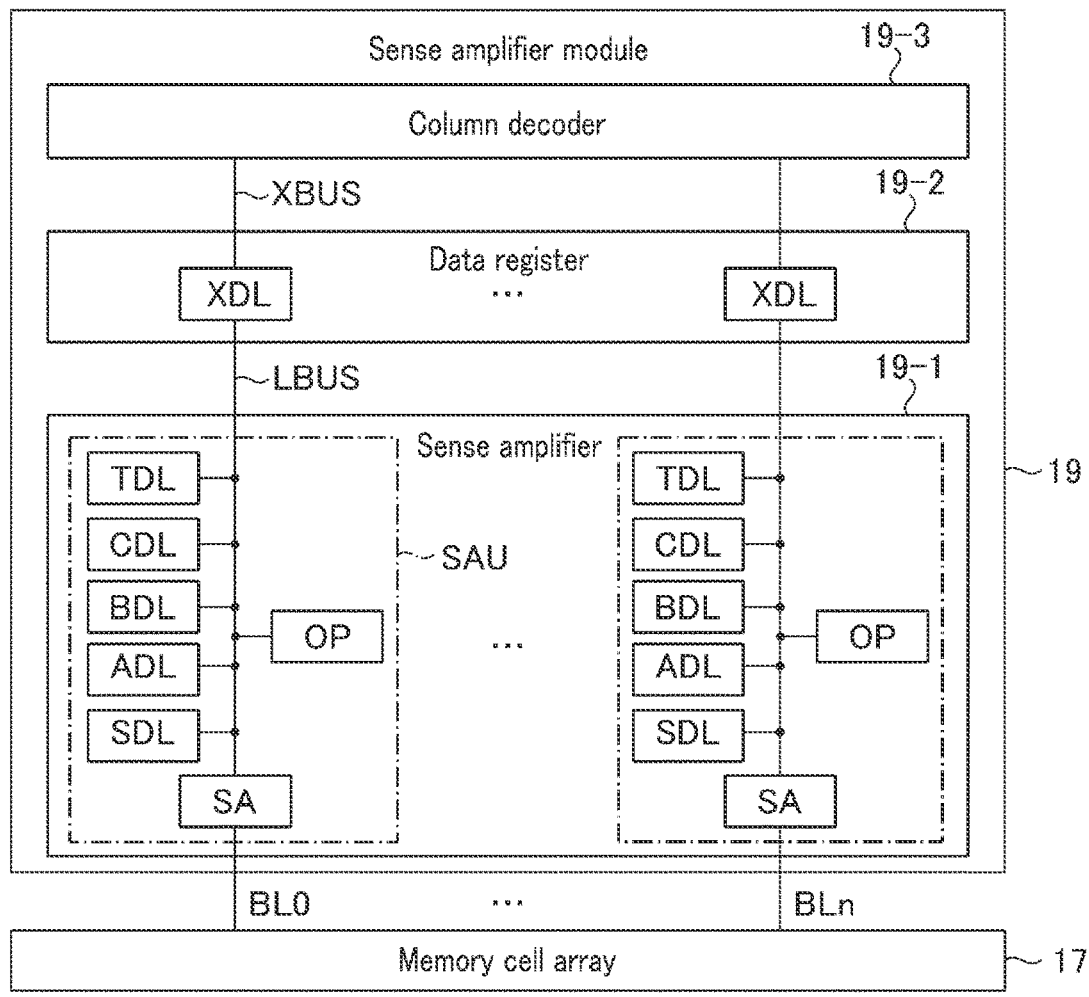
FIG. 5 is a block diagram showing an example of a sense amplifier module according to the first embodiment.

Next, the arrangement of the sense amplifier module according to the first embodiment will be described. FIG. 5 is a block diagram showing an example of the sense amplifier module according to the first embodiment. As shown in FIG. 5, the sense amplifier module 19 includes a sense amplifier 19-1, a data register 19-2, and a column decoder 19-3.

The sense amplifier 19-1 includes a plurality of sense amplifier units SAU provided for each bit line BL. The data register 19-2 includes a plurality of latch circuits XDL provided for each sense amplifier unit SAU.

The sense amplifier unit SAU includes, for example, a sense circuit SA, an operation unit OP, and latch circuits SDL, ADL, BDL, CDL, and TDL. The sense circuit SA and the latch circuits SDL, ADL, BDL, CDL, and TDL are commonly connected to the corresponding latch circuit XDL via a bus LBUS. In other words, the latch circuit XDL, the sense circuit SA, and the latch circuits SDL, ADL, BDL, CDL, and TDL are connected so as to be capable of transmitting/receiving data between each other via the bus LBUS.

During the read process, the sense circuit SA senses the threshold voltage of the memory cell transistor MT via the corresponding bit line BL, thereby determining whether the data stored in the memory cell transistor MT is "0" or "1". During the write process, the sense circuit SA applies a voltage to the bit line BL based on the write data.

The operation unit OP executes various logical operations using data stored in the latch circuits XDL, SDL, ADL, BDL, CDL, and TDL. Note that the sense amplifier 19-1 may separately include an operation circuit that executes various logical operations instead of the operation unit OP.

The latch circuits SDL, ADL, BDL, CDL, and TDL temporarily store the read data DAT or the write data DAT. For example, in the read process, the read data DAT is stored in one of the latch circuits SDL, ADL, BDL, CDL, and TDL. For example, in the write process, the write data DAT in the latch circuit XDL is stored in one of the latch circuits SDL, ADL, BDL, CDL, and TDL.

The latch circuit XDL is used as a cash memory between the sense amplifier unit SAU and the column decoder 19-3. More specifically, the write data DAT received from the column decoder 19-3 is transmitted to the latch circuits SDL, ADL, BDL, CDL, and TDL or the sense circuit SA via the latch circuit XDL. The read data DAT stored in the latch circuits SDL, ADL, BDL, CDL, and TDL or the sense circuit SA is transmitted to the column decoder 19-3 via the latch circuit XDL.

The column decoder 19-3 is connected, via a plurality of buses XBUS, to the plurality of corresponding latch circuits XDL. During the write process, the column decoder 19-3 receives the write data DAT from the input/output circuit 11. Then, the column decoder 19-3 transmits the write data DAT to the latch circuit XDL corresponding to the column address. During the read process, the column decoder 19-3 receives the read data DAT from the latch circuit XDL corresponding to the column address. Then, the column decoder 19-3 transmits the read data DAT to the input/output circuit 11.

1.1.7 Sense Circuit

Figure 6:
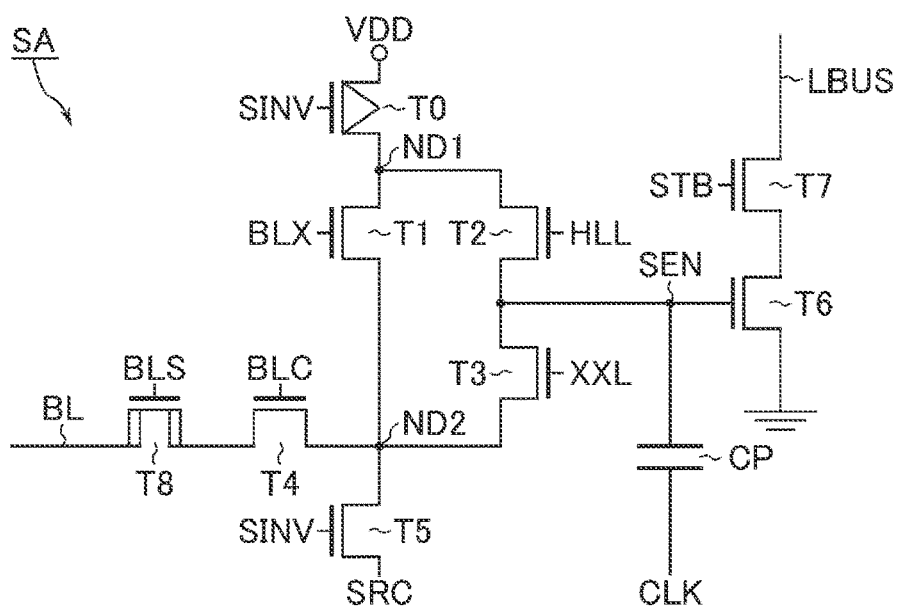
FIG. 6 is a circuit diagram showing an example of the arrangement of a sense circuit according to the first embodiment.

Next, the arrangement of the sense circuit according to the first embodiment will be described. FIG. 6 is a circuit diagram showing an example of the arrangement of the sense circuit according to the first embodiment. As shown in FIG. 6, the sense circuit includes nine transistors T0 to T8, and a capacitor CP. The transistor T0 is a p-type MOS transistor. The transistors T1 to T8 are n-type MOS transistors. The transistor T8 is an n-type MOS transistor having a higher withstand voltage than the transistors T1 to T7.

A power supply voltage VDD is supplied to the first end of the transistor T0. The second end of the transistor T0 is connected to a node ND1. The control end of the transistor T0 is connected to a node SINV.

The first end of the transistor T1 is connected to the node ND1. The second end of the transistor T1 is connected to a node ND2. The control end of the transistor T1 is connected to a node BLX.

The first end of the transistor T2 is connected to the node ND1. The second end of the transistor T2 is connected to a node SEN. The control end of the transistor T2 is connected to a node HLL.

The first end of the transistor T3 is connected to the node SEN. The second end of the transistor T3 is connected to the node ND2. The control end of the transistor T3 is connected to a node XXL.

The first end of the transistor T4 is connected to the node ND2. The second end of the transistor T4 is connected to the first end of the transistor T8. The second end of the transistor T8 is connected to the bit line BL. The control end of the transistor T4 is connected to a node BLC. The control end of the transistor T8 is connected to a node BLS.

The first end of the transistor T5 is connected to the node ND2. The second end of the transistor T5 is connected to a node SRC. The control end of the transistor T5 is connected to the node SINV.

The first end of the transistor T6 is grounded. The second end of the transistor T6 is connected to the first end of the transistor T7. The second end of the transistor T7 is connected to the bus LBUS. The control end of the transistor T6 is connected to the node SEN. The control end of the transistor T7 is connected to a node STB.

The first end of the capacitor CP is connected to the node SEN. A clock signal CLK is supplied to the second end of the capacitor CP.

With the arrangement as described above, during the read process, the sense circuit SA can determine the data stored in the memory cell transistor MT based on the voltage of the node SEN. As a result of determination, the data read out to the node SEN is transferred to the latch circuit SDL or the like via the bus LBUS.

1.1.8 ECC Circuit

Figure 7:
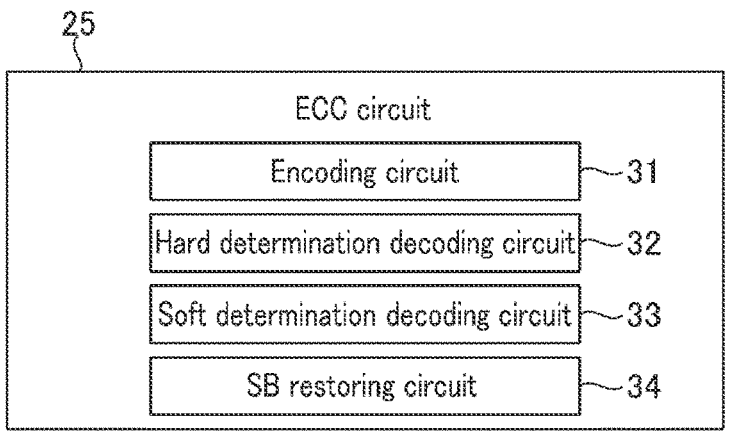
FIG. 7 is a block diagram showing an example of the arrangement of an ECC circuit according to the first embodiment.

Next, the arrangement of the ECC circuit 25 will be described. FIG. 7 is a block diagram showing an example of the arrangement of the ECC circuit according to the first embodiment. The ECC circuit 25 includes an encoding circuit 31, a hard determination decoding circuit 32, a soft determination decoding circuit 33, and an SB restoring circuit 34.

The encoding circuit 31 is a circuit that performs an encoding process of data. In the encoding process, the encoding circuit 31 generates an error correction code, and gives it to the write data.

The hard determination decoding circuit 32 is a circuit that performs a hard determination decoding process. The hard determination decoding process includes an error detection process and an error correction process performed using the hard bit data of multiple pages of the read data read out from the non-volatile memory 10. The hard bit data will be described later.

The soft determination decoding circuit 33 is a circuit that performs a soft determination decoding process. The soft determination decoding process includes an error detection process and an error correction process performed using the hard bit data and soft bit data of multiple pages of the read data read out from the non-volatile memory 10. The soft bit data will be described later. When performing the soft determination decoding process, the soft determination decoding circuit 33 uses a log-likelihood ratio (LLR) table. The LLR table is a table showing the correspondence relationship between the soft bit data and the log likelihood ratio. The LLR table includes log likelihood ratio values (LLR values). The LLR value is information expressing the likelihood that the data is "0" and the likelihood that the data is "1" as a log ratio. The LLR value indicates the reliability (likelihood) of the data read out using a given read voltage.

The SB restoring circuit 34 is a circuit that restores the soft bit data. During the soft determination decoding process, the non-volatile memory 10 according to this embodiment transmits the compressed soft bit data of two pages to the memory controller 20. The soft bit data of multiple pages are compressed into the compressed soft bit data of two pages. The compressed soft bit data will be described later.

The SB restoring circuit 34 restores the soft bit data of multiple pages using the hard bit data of multiple pages and the compressed soft bit data of two pages.

More specifically, when performing the soft determination decoding process on the data written in a given cell unit CU in the TLC mode, the non-volatile memory 10 performs multiple read processes from the given cell unit CU. With this, the non-volatile memory 10 generates the hart bit data of three pages and the compressed soft bit data of two pages. The SB restoring circuit 34 restores the soft bit data of three pages from the hard bit data of three pages and the compressed soft bit data of two pages, which have been generated by the non-volatile memory 10.

Figure 8:
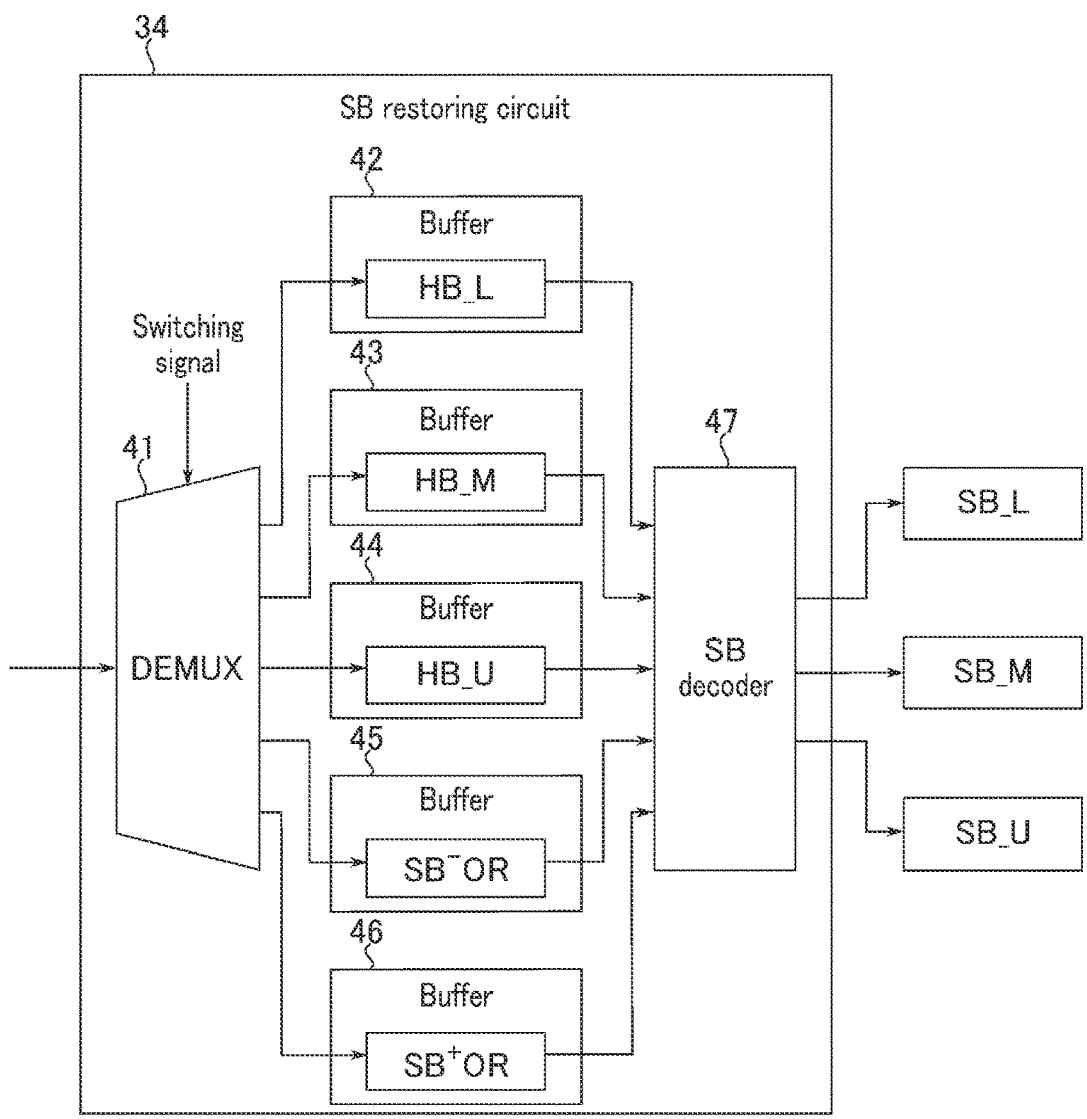
FIG. 8 is a block diagram showing an example of the arrangement of an SB restoring circuit according to the first embodiment.

FIG. 8 is a block diagram showing an example of the arrangement of the SB restoring circuit according to the first embodiment. FIG. 8 shows an example of the SB restoring circuit 34 corresponding to the soft determination decoding process for the data written in the TLC mode. As shown in FIG. 8, the SB restoring circuit 34 includes a de-multiplexer (DEMUX) 41, five buffers 42 to 46, and an SB decoder 47.

The DEMUX 41 is a connection circuit. The DEMUX 41 electrically connects the input terminal and one of four output terminals connected to the buffers 42 to 46, respectively, based on a switching signal from the control circuit 21.

The buffer 42 is a buffer that temporarily stores hard bit data HB_L corresponding to the lower page. The buffer 42 receives the hard bit data HB_L from the DEMUX 41. For example, the buffer 42 stores, the hard bit data HB_L having a data length of m bits (m is an integer equal to or smaller than n). Note that the data length which the buffer 42 can store may be equal to or different from the data length (ECC frame) for which the error detection process and the error correction process are collectively performed.

The buffer 43 is a buffer that temporarily stores hard bit data HB_M corresponding to the middle page. The buffer 43 receives the hard bit data HB_M from the DEMUX 41. For example, similar to the buffer 42, the buffer 43 stores the hard bit data HB_M having a data length of m bits.

The buffer 44 is a buffer that temporarily stores hard bit data HB_U corresponding to the upper page. The buffer 44 receives the hard bit data HB_U from the DEMUX 41. For example, similar to the buffer 42, the buffer 44 stores the hard bit data HB_U having a data length of m bits.

The buffer 45 is a buffer that temporarily stores compressed soft bit data $SB^-OR$ of one page of the compressed soft bit data SB of two pages. The buffer 45 receives the compressed soft bit data $SB^-OR$ from the DEMUX 41. For example, similar to the buffer 42, the buffer 45 stores the compressed soft bit data $SB^-OR$ having a data length of m bits. Details of the compressed soft bit data $SB^-OR$ will be described later.

The buffer 46 is a buffer that temporarily stores compressed soft bit data $SB^+OR$ of one page of the compressed soft bit data SB of two pages. The buffer 46 receives the compressed soft bit data $SB^+OR$ from the DEMUX 41. For example, similar to the buffer 42, the buffer 46 stores the compressed soft bit data $SB^+OR$ having a data length of m bits. Details of the compressed soft bit data $SB^+OR$ will be described later.

The SB decoder 47 is a restoring circuit of the soft bit data SB. The SB decoder 47 receives the hard bit data HB_L, HB_M, and HB_U and the compressed soft bit data $SB^-OR$ and $SB^+OR$. Based on the hard bit data HB_L, HB_M, and HB_U and the compressed soft bit data $SB^-OR$ and $SB^+OR$, the SB decoder 47 restores the soft bit data SB_L corresponding to the lower page, the soft bit data SB_M corresponding to the middle page, and the soft bit data SB_U corresponding to the upper page. For example, the SB decoder 47 transmits the soft bit data SB_L, SB_M, and SB_U to the soft determination decoding circuit 33.

1.1.9 Hard Bit Data and Soft Bit Data

Figure 9:
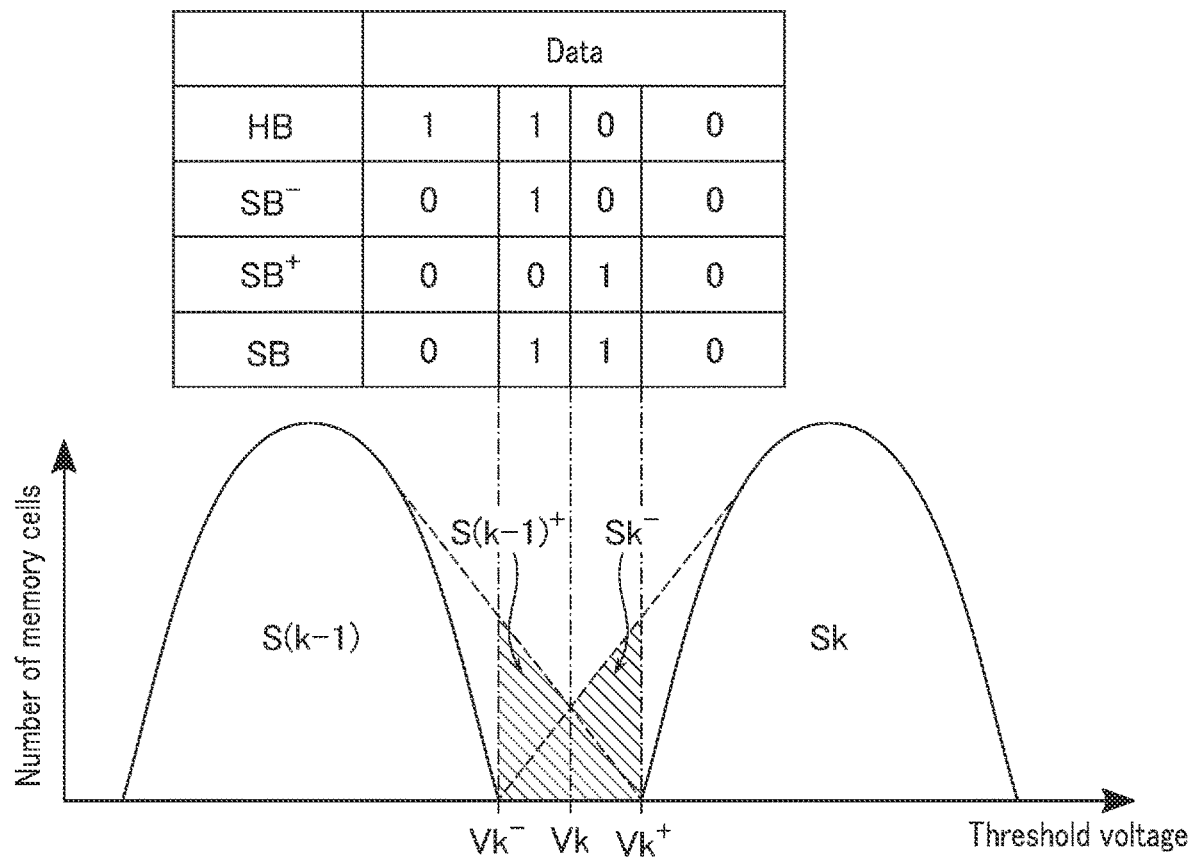
FIG. 9 is a view showing an example of the definition of hard bit data and soft bit data in a memory system according to the first embodiment.

Next, the definition of the hard bit data and the soft bit data will be described. FIG. 9 is a view showing an example of the definition of the hard bit data and the soft bit data according to the first embodiment. FIG. 9 shows the relationship among the threshold voltage distribution of the memory cell transistor MT belonging to the "S(k−1)" state, the threshold voltage distribution of the memory cell transistor MT belonging to the "Sk" state, hard bit data HB, and soft bit data SB (1≤k≤7).

Immediately after data is written, two threshold voltage distributions corresponding to the "S(k−1)" state and the "Sk" state, respectively, do not overlap each other. Therefore, it is possible to distinguish the memory cell transistor MT belonging to the "S(k−1)" state from the memory cell transistor MT belonging to the "Sk" state by a read process Rk using a read voltage Vk set between the two threshold voltage distributions.

However, due to the influence of read disturbance and data retention, etc., the two threshold voltage distributions can overlap each other. In this case, data read out from the memory cell transistor MT whose threshold voltage falls within the range where the two threshold voltage distributions overlap can be an error bit. More specifically, for example, when performing the read process Rk, data read out from the memory cell transistor MT having a threshold voltage equal to or higher than the read voltage Vk, among the memory cell transistors MT written as the "S(k−1)" state, can be incorrectly determined to belong to the "Sk" state. Further, for example, when performing the read process Rk, data read out from the memory cell transistor MT having a threshold voltage lower than the voltage Vk, among the memory cell transistors MT written as the "Sk" state, can be incorrectly determined to belong to the "S(k−1)" state. If the number of error bits having occurred exceeds the number of bits for which the ECC circuit 25 can perform error correction, it is difficult to correctly read the data.

To solve this problem, in this embodiment, two read voltages Vk$^-$ and Vk$^+$ sandwiching the read voltage Vk are set. The read voltage Vk$^-$ is a voltage lower than the read voltage Vk. The read voltage Vk$^+$ is a voltage higher than the read voltage Vk.

With this, based on the read process Rk, a read process Rk$^-$ using the read voltage Vk$^-$, and a read process Rk$^+$ using the read voltage Vk$^+$, it is possible to distinguish the memory cell transistor MT having a threshold voltage lower than the voltage Vk$^-$, the memory cell transistor MT having a threshold voltage between Vk$^-$ (inclusive) and Vk$^+$ (inclusive), and the memory cell transistor MT having a threshold voltage higher than the voltage Vk$^+$.

In the following description, the state of the memory cell transistor MT whose threshold voltage falls within a voltage range between Vk$^-$ (inclusive) and Vk (exclusive) is referred so as the "S(k−1)$^+$" state. The state of the memory cell transistor MT whose threshold voltage falls within a voltage range between Vk (inclusive) and Vk$^+$ (inclusive) is referred to as the "Sk$^-$" state. Then, the state corresponding to the "Sk" state excluding the "Sk$^+$" state and the "Sk$^-$" state is referred to as the "Sk$^0$" state. Note that, for the sake of descriptive convenience, the "S0$^-$" state and the "S7$^+$" state are included in the "S0$^0$" state and the "S7$^0$" state, respectively.

Further, in the following description, data which distinguishes the "S(k−1)" state and the "Sk" state is referred to as the hard bit data. In the hard bit data HB, the "S(k−1)" state is expressed by "1", and the "Sk" state is expressed by "0".

Data which distinguishes the "S(k−1)$^0$" state, the "S(k−1)$^+$" state, and the "Sk" state is referred to as partial soft bit data SB$^-$. In the partial soft bit data SB$^-$, the "S(k−1)$^+$" state and the "Sk" state are expressed by "0", and the "S(k−1)$^+$" state is expressed by "1". The partial soft bit data SB$^-$ is generated by, for example, an AND operation of the result of the read process Rk and the logical NOT of the result of the read process Rk$^-$.

Data which distinguishes the "S(k−1)" state, the "Sk$^-$" state, and the "Sk$^0$" state is referred to as partial soft bit data SB$^+$. In the partial soft bit data SB$^+$, the "S(k−1)" state and the "Sk$^0$" state are expressed by "0", and the "Sk$^-$" state is expressed by "1". The partial soft bit data SB$^+$ is generated by, for example, an AND operation of the logical NOT of the result of the read process Rk and the result of the read process Rk$^+$.

Data which distinguishes the "S(k−1)$^0$" state, the "Sk$^0$" state, and the state including the "S(k−1)$^+$" state and the "Sk$^-$" state is referred to as the soft bit data SB. In the soft bit data SB, the "S(k−1)$^0$" state and the "Sk$^0$" state are expressed by "0", and the state including the "S(k−1)$^+$" state and the "Sk$^-$" state is expressed by "1". The soft bit data SB is generated by, for example, an OR operation of the partial soft bit data SB$^-$ and the partial soft bit data SB$^+$.

Figure 10:
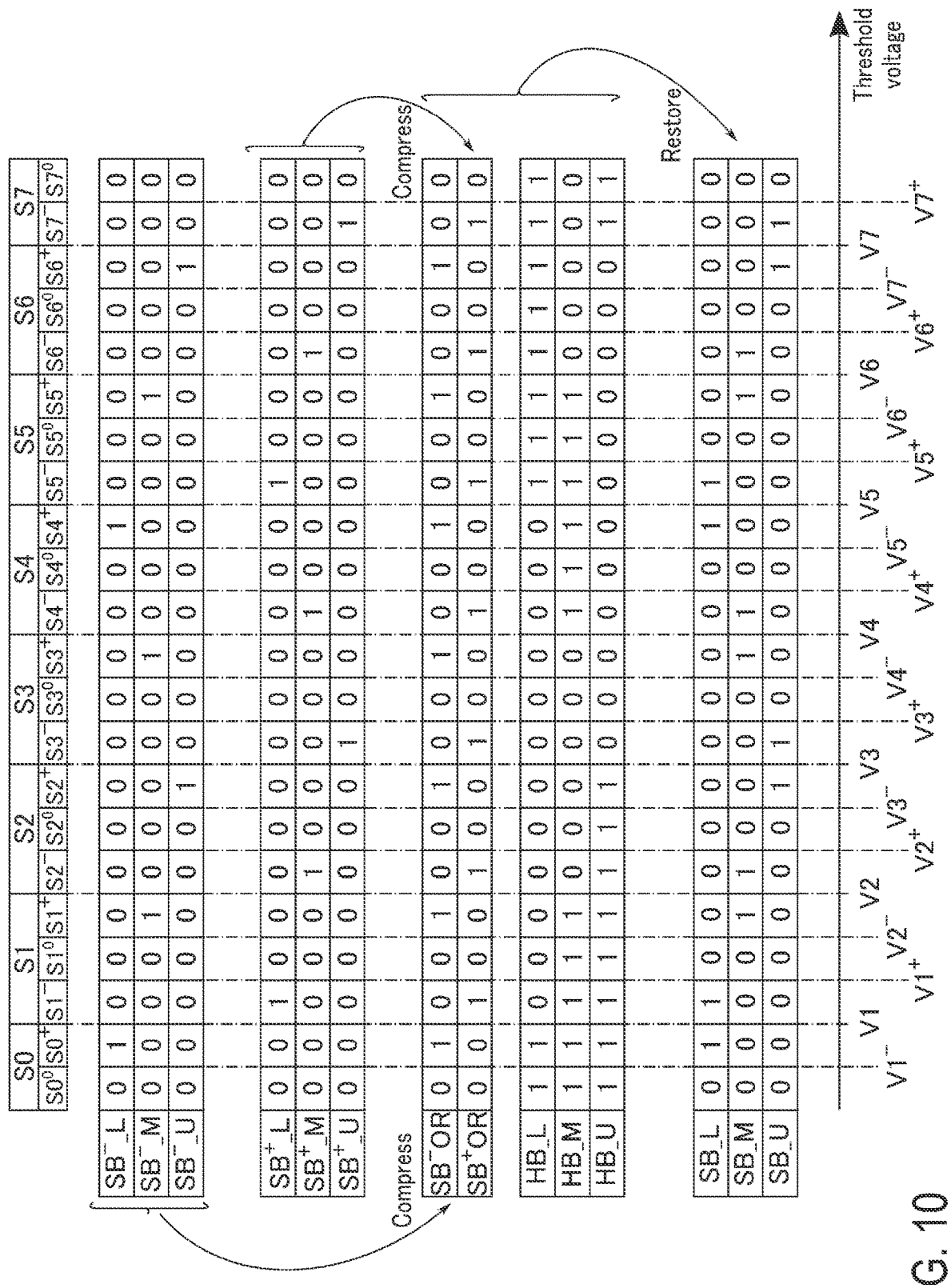
FIG. 10 is a view showing an example of the relationship among partial soft bit data, compressed soft bit data, and soft bit data in the memory system according to the first embodiment.

FIG. 10 is a view showing an example of the relationship among the partial soft bit data, the compressed soft bit data, and the soft bit data in the memory system according to the first embodiment.

Based on the definition described above, the non-volatile memory 10 generates the hard bit data HB_L and partial soft bit data SB$^-$_L and SB$^+$_L corresponding to the lower page, the hard bit data HB_M and partial soft bit data SB$^-$_M and SB$^+$_M corresponding to the middle page, and the hard bit data HB_U and partial soft bit data SB$^-$_U and SB$^+$_U corresponding to the upper page.

The partial soft bit data SB$^-$_L is "1" in the "S0$^+$" state and the "S4$^+$" state, and "0" in the other states. The partial soft bit data SB$^-$_M is "1" in the "S1$^+$" state, the "S3$^+$" state, and the "S5$^+$" state, and "0" in the other states. The partial soft bit data SB$^-$_U is "1" in the "S2$^+$" state and the "S6$^+$" state, and "0" in the other states. In this manner, the partial soft bit data SB$^-$_L, SB$^-$_M, and SB$^-$_U are "1" in the states that do not overlap each other.

The non-volatile memory 10 generates the compressed soft bit data SB$^-$OR by executing an OR operation of the partial soft bit data SB$^-$_L, SB$^-$_M, and SB$^-$_U. Therefore, the compressed soft bit data SB$^-$OR is "1" in the "S0$^+$" state, the "S1$^+$" state, the "S2$^+$" state, the "S3$^+$" state, the "S4$^+$" state, the "S5$^+$" state, and the "S6$^+$" state, and "0" in the other states.

The partial soft bit data SB$^+$_L is "1" in the "S1$^-$" state and the "S5$^-$" state, and "0" in the other states. The partial soft bit data SB$^+$_M is "1" in the "S2$^-$" state, the "S4$^-$" state, and the "S6$^-$" state, and "0" in the other states. The partial soft bit data SB$^+$_U is "1" in the "S3$^-$" state and the "S7$^-$" state, and "0" in the other states. In this manner, the partial soft bit data SB$^+$_L, SB$^+$_M, and SB$^+$_U are "1" in the states that do not overlap each other.

The non-volatile memory 10 generates the compressed soft bit data SB$^+$OR by executing an OR operation of the partial soft bit data SB$^+$_L, SB$^+$_M, and SB$^+$_U. Therefore, the compressed soft bit data SB$^+$OR is "1" in the "S1$^-$" state, the "S2⁻" state, the "S3⁻" state, the "S4⁻" state, the "S5⁻" state, the "S6⁻" state, and the "S7⁻" state, and "0" in the other states.

The non-volatile memory 10 outputs, to the memory controller 20, the compressed soft bit data SB⁻OR and SB⁺OR of two pages generated by the above-described operation process and the hard bit data HB_L, HB_M, and HB_U of three pages.

Based on the compressed soft bit data SB⁻OR and SB⁺OR of two pages and the hard bit data HB_L, HB_M, and HB_U of three pages, the SB decoder 47 generates the soft bit data SB_L, SB_M, and SB_U of three pages.

The soft bit data SB_L corresponding to the lower page is "1" in the "S0⁺" state, the "S1⁻" state, the "S4⁺" state, and the "S5⁻" state, and "0" in the other states. The SB decoder 47 generates the soft bit data SB_L by, for example, the following operations.

$$SB\_L = (L0 \mid L4) \& SB-OR \mid (L1 \mid L5) \& SB^+OR$$

$$L0 = HB\_L \& HB\_M \& HB\_U$$

$$L1 = \sim HB\_L \& HB\_M \& HB\_U$$

$$L4 = \sim HB\_L \& HB\_M \& \sim HB\_U$$

$$L5 = HB\_L \& HB\_M \& \sim HB\_U$$

Here, "&" is the AND symbol. "|" is the OR symbol. "~" is the NOT symbol.

The soft bit data SB_M corresponding to the middle page is "1" in the "S1⁺" state, the "S2⁻" state, the "S3⁺" state, the "S4⁻" state, the "S5⁺" state, and the "S6⁻" state, and "0" in the other states. The SB decoder 47 generates the soft bit data SB_M by, for example, the following operations.

$$SB\_M = (L1 \mid L3 \mid L5) \& SB-OR \mid (L2 \mid L4 \mid L6) \& SB^+OR$$

$$L2 = \sim HB\_L \& \sim HB\_M \& HB\_U$$

$$L3 = \sim HB\_L \& \sim HB\_M \& \sim HB\_U$$

$$L6 = HB\_L \& \sim HB\_M \& \sim HB\_U$$

The soft bit data SB_U corresponding to the upper page is "1" in the "S2⁺" state, the "S3⁻" state, the "S6⁺" state, and the "S7⁻" state, and "0" in the other states. The SB decoder 47 generates the soft bit data SB_U by, for example, the following operations.

$$SB\_U = (L2 \mid L) \& SB-OR \mid (L3 \mid L7) \& SB^+OR$$

$$L7 = HB\_L \& \sim HB\_M \& HB\_U$$

In this manner, the non-volatile memory 10 compresses the partial soft bit data SB⁻_L, SB⁻_M, SB⁻_U, SB⁺_L, SB⁺_M, and SB⁺_U of six pages into the compressed soft bit data SB⁻OR and SB⁺OR of two pages. Based on the hard bit data HB_L, HB_M, and HB_U of three pages and the compressed soft bit data SB⁻OR and SB⁺OR of two pages, the SB decoder 47 restores the soft bit data SB_L, SB_M, and SB_U of three pages.

1.2 Operation

Next, an operation in the memory system according to the first embodiment will be described.

1.2.1 Flowchart

Figure 11:
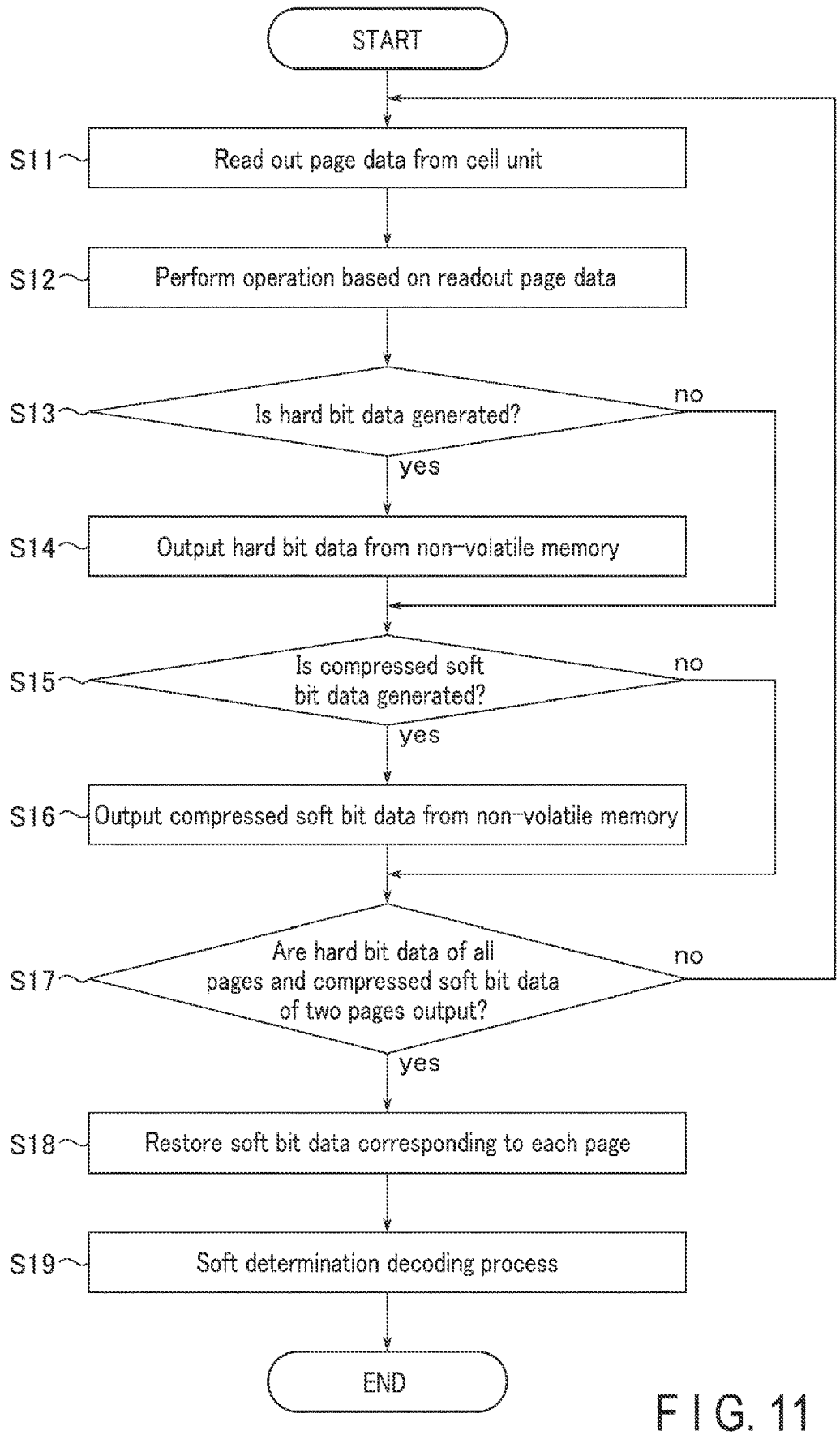
FIG. 11 is a flowchart showing an example of a series of processes including a soft determination decoding process in the memory system according to the first embodiment.

FIG. 11 is a flowchart showing an example of a series of processes including the soft determination decoding process in the memory system according to the first embodiment.

Upon receipt of a command instructing to perform a read process concerning the soft determination decoding process (start), the non-volatile memory 10 reads out page data from the target cell unit CU (step S11).

The non-volatile memory 10 performs an operation process based on the page data read out in the process in step S11 (step S12).

The non-volatile memory 10 determines whether the hard bit data HB is generated by the process in step S12 (step S13).

If the hard bit data HB is generated (YES in step S13), the non-volatile memory 10 outputs the generated hard bit data HB to the memory controller 20 (step S14).

If the hard bit data HB is not generated (NO in step S13), or after the process in step S14, the non-volatile memory 10 determines whether the compressed soft bit data SB⁻OR or SB⁺OR is generated by the process in step S12 (step S15).

If the compressed soft bit data SB⁻OR or SB⁺OR is generated (YES in step S15), the non-volatile memory 10 outputs the generated compressed soft bit data SB⁻OR or SB⁺OR to the memory controller 20 (step S16).

If the compressed soft bit data SB⁻OR or SB⁺OR is not generated (NO in step S15), or after the process in step S16, the non-volatile memory 10 determines whether the hard bit data HB of all pages and the compressed soft bit data SB⁻OR and SB⁺OR of two pages are output (step S17).

If there is the hard bit data HB or the compressed soft bit data SB⁻OR or SB⁺OR which has not been output (NO in step S17), the non-volatile memory 10 reads out page data from the target cell unit CU (step S11). Then, the processes in subsequent steps S12 to S17 are performed. In this manner, until the hard bit data HB of all pages and the compressed soft bit data SB⁻OR and SB⁺OR of two pages are output, the processes in steps S11 to S17 are repeated.

If the hard bit data HB of all pages and the compressed soft bit data SB⁻OR and SB⁺OR of two pages have been output (YES in step S17), the memory controller 20 restores the soft bit data SB corresponding to each page (step S18).

The memory controller 20 performs the soft determination decoding process using the soft bit data SB corresponding to each page restored by the process in step S18 (step S19).

After the process in step S19, the series of processes including the soft determination decoding process ends (end).

1.2.2 Command Sequence

Figure 12:
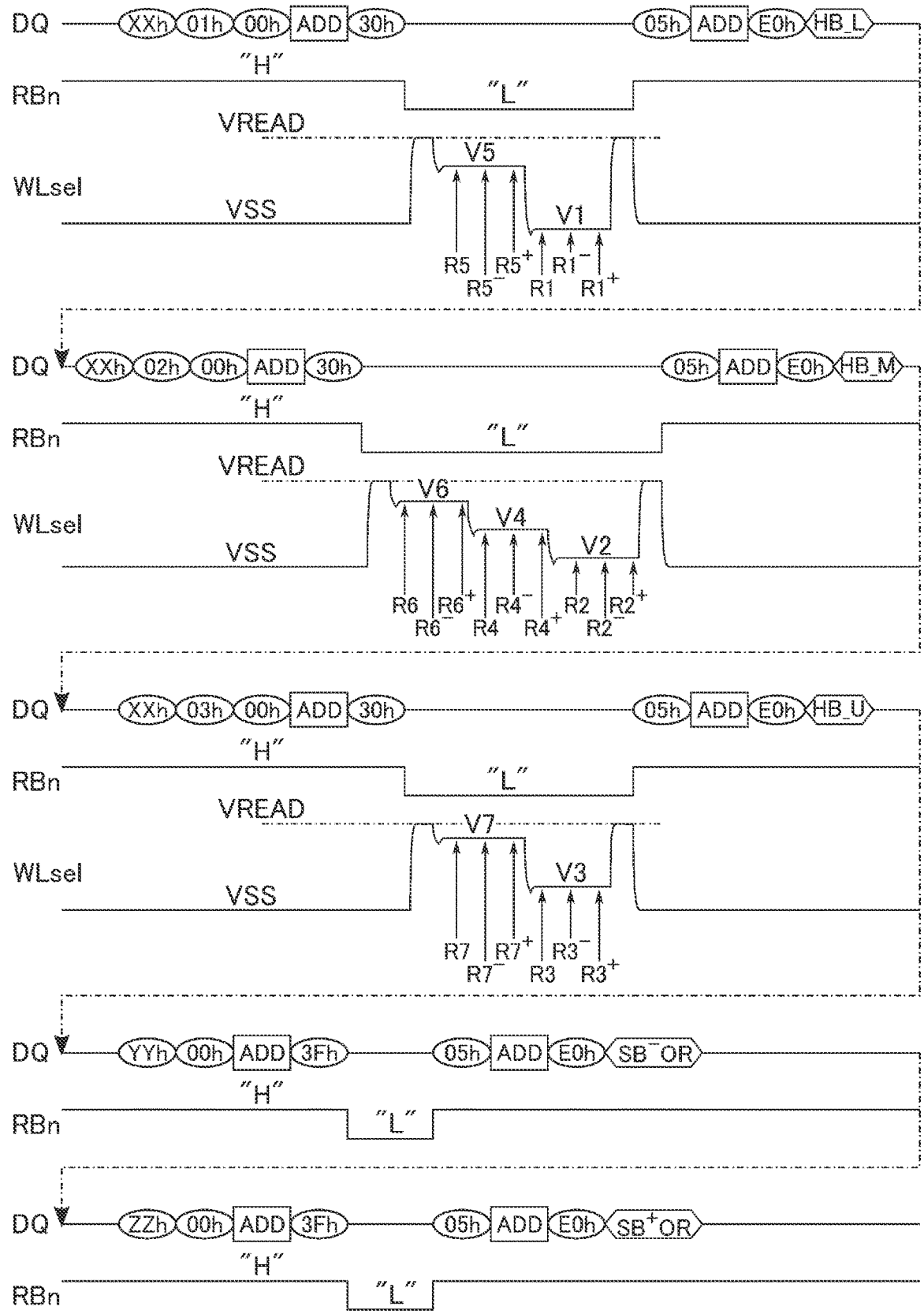
FIG. 12 is a command sequence showing an example of a series of processes including the soft determination decoding process in the memory system according to the first embodiment.

FIG. 12 is a command sequence showing an example of a series of processes including the soft determination decoding process in the memory system according to the first embodiment. FIG. 12 shows the signals DQ and RBn communicated between the non-volatile memory 10 and the memory controller 20 in the series of processes including the soft determination decoding process, and the voltage applied to a selected word line WLsel in the non-volatile memory 10. Note that in FIG. 12, the command CMD, the address ADD, and the data included in the signal DQ are expressed by a circle, a square, and a hexagon, respectively.

The memory controller 20 transmits, to the non-volatile memory 10, a command "XXh", a command "01h", a command "00h", the address ADD, and a command "30h" in this order. The command "XXh" is a command instructing to perform the process concerning the soft determination decoding. The command "01h" is a command instructing to perform the process corresponding to the lower page. The command "00h" is a command instructing to perform a read process. The address ADD is address information indicating the cell unit CU to be the target of the read process. The command "30h" is a command instructing to start the read process.

If the command "30h" is received, the non-volatile memory 10 asserts the signal RBn from "H" level to "L" level to transition to the busy state, and starts the read process corresponding to the lower page. More specifically, the row decoder 18 applies the voltage VREAD to the selected word line WLsel, and then applies the read voltages V5 and V1 in this order. After applying the read voltage V1, the row decoder 18 applies the voltage VREAD to the selected word line WLsel again, and then applies a voltage VSS.

While the read voltage V5 is being applied, the sense amplifier module 19 performs the read processes R5, R5$^-$, and R5$^+$ in this order. The sense amplifier module 19 performs the read processes R5, R5$^-$, and R5$^+$ by, for example, adjusting the period (sense period) from charging to sensing of the node SEN. More specifically, for example, the sense period in the read process R5$^-$ is shorter than the sense period in the read process R5. The sense period in the read process R5$^+$ is longer than the sense period in the read process R5.

While the read voltage V1 is being applied, the sense amplifier module 19 performs the read processes R1, R1$^-$, and R1$^+$ in this order. For example, the sense period in the read process R1$^-$ is shorter than the sense period in the read process R1. The sense period in the read process R1$^+$ is longer than the sense period in the read process R1.

The sense amplifier module 19 performs the operation process based on the data read out by various read processes. With this, the hard bit data HB_L is generated.

If the read process R1$^+$ ends, the non-volatile memory 10 negates the signal RBn from "L" level to "H" level to transition to the ready state.

If the signal RBn at "H" level is received, the memory controller 20 transmits, to the non-volatile memory 10, a command "05h", the address ADD, and a command "E0h" in this order. The command "05h" is a command instructing to output data. The address ADD is address information specifying the data to be output. The command "E0h" is a command instructing to start data output.

If the command "E0h" is received, the non-volatile memory 10 outputs the hard bit data HB_L to the memory controller 20.

If the hard bit data HB_L is received, the memory controller 20 transmits, to the non-volatile memory 10, the command "XXh", a command "02h", the command "00h", the address ADD, and the command "30h" in this order. The command "02h" is a command instructing to perform the process corresponding to the middle page.

If the command "30h" is received, the non-volatile memory 10 asserts the signal RBn from "H" level to "L" level to transition to the busy state, and starts the read process corresponding to the middle page. More specifically, the row decoder 18 applies the voltage VREAD to the selected word line WLsel, and then applies the read voltages V6, V4, and V2 in this order. After applying the read voltage V2, the row decoder 18 applies the voltage VREAD to the selected word line WLsel again, and then applies the voltage VSS.

While the read voltage V6 is being applied, the sense amplifier module 19 performs the read processes R6, R6$^-$, and R6$^+$ in this order. For example, the sense period in the read process R6$^-$ is shorter than the sense period in the read process R6. The sense period in the read process R6$^+$ is longer than the sense period in the read process R6.

While the read voltage V4 is being applied, the sense amplifier module 19 performs the read processes R4, R4$^-$, and R4$^+$ in this order. For example, the sense period in the read process R4$^-$ is shorter than the sense period in the read process R4. The sense period in the read process R4$^+$ is longer than the sense period in the read process R4.

While the read voltage V2 is being applied, the sense amplifier module 19 performs the read processes R2, R2$^-$, and R2$^+$ in this order. For example, the sense period in the read process R2$^-$ is shorter than the sense period in the read process R2. The sense period in the read process R2$^+$ is longer than the sense period in the read process R2.

The sense amplifier module 19 performs the operation process based on the data read out by various read processes. With this, the hard bit data HB_M is generated.

If the read process R2$^+$ ends, the non-volatile memory 10 negates the signal RBn from "L" level to "H" level to transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the hard bit data HB_M to the memory controller 20.

If the hard bit data HB_M is received, the memory controller 20 transmits, to the non-volatile memory 10, the command "XXh", a command "03h", the command "00h", the address ADD, and the command "30h" in this order. The command "03h" is a command instructing to perform the process corresponding to the upper page.

If the command "30h" is received, the non-volatile memory 10 asserts the signal RBn from "H" level to "L" level to transition to the busy state, and starts the read process corresponding to the upper page. More specifically, the row decoder 18 applies the voltage VREAD to the selected word line WLsel, and then applies the read voltages V7 and V3 in this order. After applying the read voltage V3, the row decoder 18 applies the voltage VREAD to the selected word line WLsel again, and then applies the voltage VSS.

While the read voltage V7 is being applied, the sense amplifier module 19 performs the read processes R7, R7$^-$, and R7$^+$ in this order. For example, the sense period in the read process R7$^-$ is shorter than the sense period in the read process R7. The sense period in the read process R7$^+$ is longer than the sense period in the read process R7. While the read voltage V3 is being applied, the sense amplifier module 19 performs the read processes R3, R3$^-$, and R3$^+$ in this order. For example, the sense period in the read process R3$^-$ is shorter than the sense period in the read process R3. The sense period in the read process R3$^+$ is longer than the sense period in the read process R3.

The sense amplifier module 19 performs the operation process based on the data read out by various read processes. With this, the hard bit data HB_U and the compressed soft bit data SB$^-$OR and SB$^+$OR are generated. At this time, the hard bit data HB_U and the compressed soft bit data SB$^-$OR and SB$^+$OR are stored in the latch circuits XDL, ADL, and BDL, respectively.

If the read process R3$^+$ ends, the non-volatile memory 10 negates the signal RBn from "L" level to "H" level to transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the hard bit data HB_U to the memory controller 20.

If the hard bit data HB_U is received, the memory controller 20 transmits, to the non-volatile memory 10, a command "YYh", the command "00h", the address ADD, and a command "3Fh" in this order. A set of the command "YYh", the command "00h", and the address ADD instructs to, for example, transfer the compressed soft bit data SB$^-$OR stored in the latch circuit ADL to the latch circuit XDL. The command "3Fh" is a command instructing to start data transfer.

If the command "3Fh" is received, the non-volatile memory 10 asserts the signal RBn from "H" level to "L" level to transition to the busy state, and starts data transfer from the latch circuit ADL to the latch circuit XDL. If the data transfer ends, the non-volatile memory 10 negates the signal RBn from "L" level to "H" level to transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the compressed soft bit data SB$^-$OR to the memory controller 20.

If the compressed soft bit data SB$^-$OR is received, the memory controller 20 transmits, to the non-volatile memory 10, a command "ZZh", the command "00h", the address ADD, and the command "3Fh" in this order. A set of the command "ZZh", the command "00h", and the address ADD instructs to, for example, transfer the compressed soft bit data SB$^+$OR stored in the latch circuit BDL to the latch circuit XDL.

If the command "3Fh" is received, the non-volatile memory 10 asserts the signal RBn from "H" level to "L" level to transition to the busy state, and starts data transfer from the latch circuit BDL to the latch circuit XDL. If the data transfer ends, the non-volatile memory 10 negates the signal RBn from "L" level to "H" level to transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the compressed soft bit data SB$^+$OR to the memory controller 20.

Thus, the command sequence showing an example of a series of processes including the soft determination decoding process ends.

1.2.3 Operation Process

Figure 13:
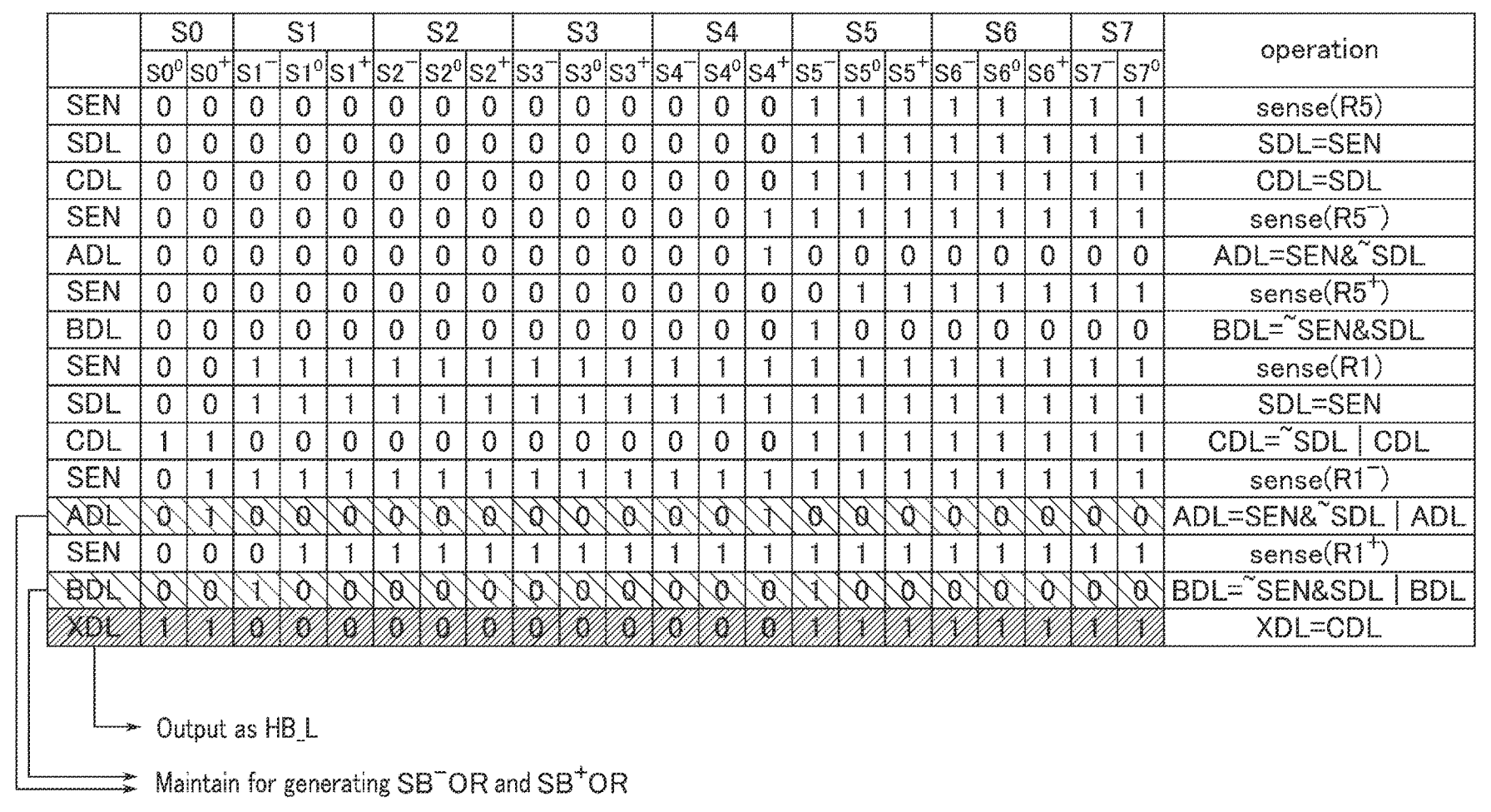
Figure 15:
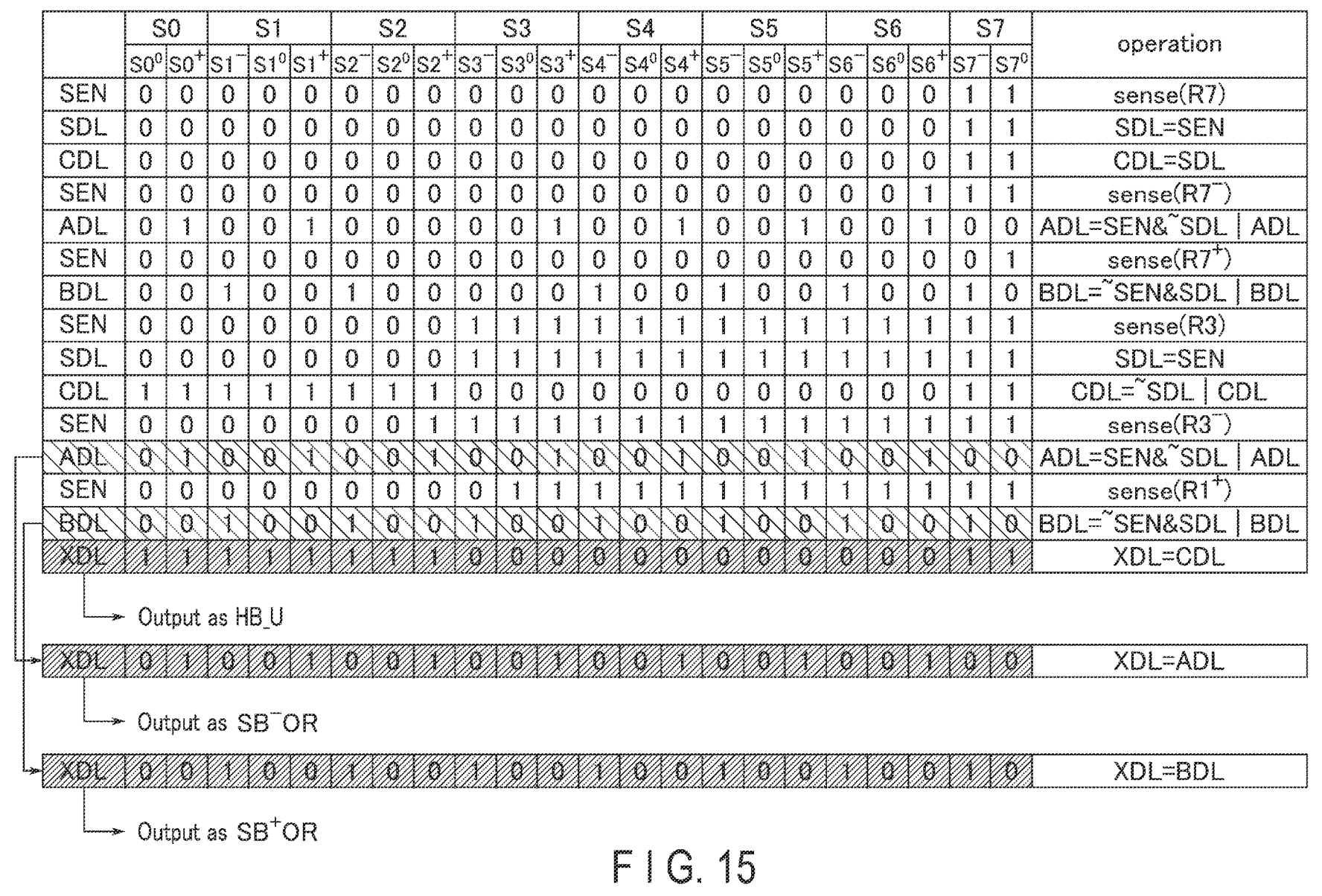

FIGS. 13, 14, and 15 are views showing an example of the operation process in the non-volatile memory according to the first embodiment. FIG. 13 shows the operation process from generation of the hard bit data HB_L up to output of the hard bit data HB_L to the memory controller 20. FIG. 14 shows the operation process, after output of the hard bit data HB_L, from generation of the hard bit data HB_M up to output of the hard bit data HB_M to the memory controller 20. FIG. 15 shows the operation process, after output of the hard bit data HB_M, from generation of the hard bit data HB_U and the compressed soft bit data SB$^-$OR and SB$^+$OR up to output thereof to the memory controller 20.

With reference to FIG. 13, the operation process concerning the hard bit data HB_L will be described.

First, the read process R5 is performed. With this, the page data which is "1" in the "S5" state to the "S7" state and "0" in the other states is stored in the node SEN. This page data is transferred to the latch circuits SDL and CDL.

Then, the read process R5$^-$ is performed. With this, the page data which is "1" in the "S4$^+$" state and the "S5" state to the "S7" state and "0" in the other states is stored in the node SEN. The operation unit OP executes (SEN&~SDL), and stores the result in the latch circuit ADL. With this, the page data stored in the latch circuit ADL is "1" in the "S4$^+$" state, and "0" in the other states.

Then, the read process R5$^+$ is performed. With this, the page data which is "1" in the "S5$^{0}$" state, the "S5$^+$" state, the "S6" state, and the "S7" state and "0" in the other states is stored in the node SEN. The operation unit OP executes (~SEN&SDL), and stores the result in the latch circuit BDL. With this, the page data stored in the latch circuit BDL is "1" in the "S5$^-$" state, and "0" in the other states.

Then, the read process R1 is performed. With this, the page data which is "1" in the "S1" state to the "S7" state and "0" in the other states is stored in the node SEN. This page data is transferred to the latch circuit SDL. The operation unit OP executes (~SDL|CDL), and stores the result in the latch circuit CDL. With this, the hard bit data HB_L is stored in the latch circuit CDL.

Then, the read process R1$^-$ is performed. With this, the page data which is "1" in the "S0$^+$" state and the "S1" state to the "S7" state and "0" in the other states is stored in the node SEN. The operation unit OP executes (SEN&~SDL|ADL), and stores the result in the latch circuit ADL. With this, the page data stored in the latch circuit ADL is "1" in the "S0$^+$" state and the "S4$^+$" state, and "0" in the other states.

Then, the read process R1$^+$ is performed. With this, the page data which is "1" in the "S1$^{0}$" state, the "S1$^+$" state, and the "S2" state to the "S7" state and "0" in the other states is stored in the node SEN. The operation unit OP executes (~SEN&SDL|BDL), and stores the result in the latch circuit BDL. With this, the page data stored in the latch circuit BDL is "1" in the "S1$^-$" state and the "S5$^-$" state, and "0" in the other states.

If the read process R1$^+$ ends, the hard bit data HB_L stored in the latch circuit CDL is transferred to the latch circuit XDL. With this, the non-volatile memory 10 can output the hard bit data HB_L to the memory controller 20. Note that the data stored in the latch circuits ADL and BDL are maintained in the subsequent processes to generate the compressed soft bit data SB$^-$OR and SB$^+$OR.

Next, with reference to FIG. 14, the operation process concerning the hard bit data HB_M will be described.

First, the read process R6 is performed. With this, the page data which is "1" in the "S6" state and the "S7" state and "0" in the other states is stored in the node SEN. This page data is transferred to the latch circuit SDL. The operation unit OP executes (~SDL), and stores the result in the latch circuit CDL. With this, the page data which is "1" in the "S0" state to the state "S5" is stored in the latch circuit CDL.

Then, the read process R6$^-$ is performed. With this, the page data which is "1" in the "S5$^+$" state, the "S6" state, and the "S7" state and "0" in the other states is stored in the node SEN. The operation unit OP executes (SEN&~SDL|ADL), and stores the result in the latch circuit ADL. With this, the page data stored in the latch circuit ADL is "1" in the "S0$^+$" state, the "S4$^+$" state, and the "S5" state, and "0" in the other states.

Then, the read process R6$^+$ is performed. With this, the page data which is "1" in the "S6$^0$" state, the "S6$^+$" state, the "S7" state and "0" in the other states is stored in the node SEN. The operation unit OP executes (~SEN&SDL|BDL), and stores the result in the latch circuit BDL. With this, the page data stored in the latch circuit BDL is "1" in the "S1$^-$" state, the "S5$^-$" state, and the "S6$^-$" state, and "0" in the other states.

Then, the read process R4 is performed. With this, the page data which is "1" in the "S4" state to the "S7" state and "0" in the other states is stored in the node SEN. This page data is transferred to the latch circuit SDL. The operation unit OP executes (SDL&CDL), and stores the result in the latch circuit CDL. With this, the page data which is "1" in the "S4" state and the state "S5" is stored in the latch circuit CDL.

Then, the read process R4$^-$ is performed. With this, the page data which is "1" in the "S3$^+$" state and the "S4" state to the "S7" state and "0" in the other states is stored in the node SEN. The operation unit OP executes (SEN&~SDL|ADL), and stores the result in the latch circuit ADL. With this, the page data stored in the latch circuit ADL is "1" in the "S0$^+$" state, the "S3$^+$" state, the "S4$^+$" state, and the "S5$^+$" state, and "0" in the other states.

Then, the read process R4$^+$ is performed. With this, the page data which is "1" in the "S4$^0$" state, the "S4$^+$" state, and the "S5" state to the "S7" state and "0" in the other states is stored in the node SEN. The operation unit OP executes (~SEN&~SDL|BDL), and stores the result in the latch circuit BDL. With this, the page data stored in the latch circuit BDL is "1" in the "S1$^-$" state, the "S4$^-$" state, the "S5$^-$" state, and the "S6$^-$" state, and "0" in the other states.

Then, the read process R2 is performed. With this, the page data which is "1" in the "S2" state to the "S7" state and "0" in the other states is stored in the node SEN. This page data is transferred to the latch circuit SDL. The operation unit OP executes (~SDL&CDL), and stores the result in the latch circuit CDL. With this, the hard bit data HB_M is stored in the latch circuit CDL.

Then, the read process R2$^-$ is performed. With this, the page data which is "1" in the "S1$^+$" state and the "S2" state to the "S7" state and "0" in the other states is stored in the node SEN. The operation unit OP executes (SEN&~SDL|ADL), and stores the result in the latch circuit ADL. With this, the page data stored in the latch circuit ADL is "1" in the "S0$^+$" state, the "S1$^+$" state, the "S3$^+$" state, the "S4$^+$" state, and the "S5$^+$" state, and "0" in the other states.

Then, the read process R2$^+$ is performed. With this, the page data which is "1" in the "S2$^0$" state, the "S2$^+$" state, and the "S3" state to the "S7" state and "0" in the other states is stored in the node SEN. The operation unit OP executes (~SEN&SDL|BDL), and stores the result in the latch circuit BDL. With this, the page data stored in the latch circuit BDL is "1" in the "S1$^-$" state, the "S2$^-$" state, the "S4$^-$" state, the "S5$^-$" state, and the "S6$^-$" state, and "0" in the other states.

If the read process R2$^+$ ends, the hard bit data HB_M stored in the latch circuit CDL is transferred to the latch circuit XDL. With this, the non-volatile memory 10 can output the hard bit data HB_M to the memory controller 20. Note that the data stored in the latch circuits ADL and BDL are maintained in the subsequent processes to generate the compressed soft bit data SB$^-$OR and SB$^+$OR.

Next, with reference to FIG. 15, the operation process concerning the hard bit data HB_U will be described.

First, the read process R7 is performed. With this, the page data which is "1" in the "S7" state and "0" in the other states is stored in the node SEN. This page data is transferred to the latch circuits SDL and CDL.

Then, the read process R7$^-$ is performed. With this, the page data which is "1" in the "S6$^+$" state and the "S7" state and "0" in the other states is stored in the node SEN. The operation unit OP executes (SEN&~SDL|ADL), and stores the result in the latch circuit ADL. With this, the page data stored in the latch circuit ADL is "1" in the "S0$^+$" state, the "S1$^+$" state, the "S3$^+$" state, the "S4$^+$" state, the "S5$^+$" state, and the "S6$^+$" state, and "0" in the other states.

Then, the read process R7$^+$ is performed. With this, the page data which is "1" in the "S7$^0$" state and "0" in the other states is stored in the node SEN. The operation unit OP executes (~SEN&SDL|BDL), and stores the result in the latch circuit BDL. With this, the page data stored in the latch circuit BDL is "1" in the "S1$^-$" state, the "S2$^-$" state, the "S4$^-$" state, the "S5$^-$" state, the "S6$^-$" state, and the "S7$^-$" state, and "0" in the other states.

Then, the read process R3 is performed. With this, the page data which is "1" in the "S3" state to the "S7" state and "0" in the other states is stored in the node SEN. This page data is transferred to the latch circuit SDL. The operation unit OP executes (~SDL|CDL), and stores the result in the latch circuit CDL. With this, the hard bit data HB_U is stored in the latch circuit CDL.

Then, the read process R3$^-$ is performed. With this, the page data which is "1" in the "S2$^+$" state and the "S3" state to the "S7" state and "0" in the other states is stored in the node SEN. The operation unit OP executes (SEN&~SDL|ADL), and stores the result in the latch circuit ADL. With this, the compressed soft bit data SB$^-$OR is stored in the latch circuit ADL.

Then, the read process R3$^+$ is performed. With this, the page data which is "1" in the "S3$^0$" state, the "S3$^+$" state, and the "S4" state to the "S7" state and "0" in the other states is stored in the node SEN. The operation unit OP executes (~SEN&SDL|BDL), and stores the result in the latch circuit BDL. With this, the compressed soft bit data SB$^+$OR is stored in the latch circuit BDL.

If the read process R3$^+$ ends, the hard bit data HB_U stored in the latch circuit CDL is transferred to the latch circuit XDL. With this, the non-volatile memory 10 can output the hard bit data HB_U to the memory controller 20.

If output of the hard bit data HB_U ends, the compressed soft bit data SB$^-$OR stored in the latch circuit ADL is transferred to the latch circuit XDL. With this, the non-volatile memory 10 can output the compressed soft bit data SB$^-$OR to the memory controller 20.

If output of the compressed soft bit data SB$^-$OR ends, the compressed soft bit data SB$^+$OR stored in the latch circuit BDL is transferred to the latch circuit XDL. With this, the non-volatile memory 10 can output the compressed soft bit data SB$^+$OR to the memory controller 20.

1.3 Effect According to First Embodiment

According to the first embodiment, the non-volatile memory 10 reads out the hard bit data HB_L, HB_M, and HB_U and the partial soft bit data SB$^-$_L, SB$^+$_L, SB$^-$_M, SB$^+$_M, SB$^-$_U, and SB$^+$_U from the target cell unit CU. Based on the OR operation of the partial soft bit data SB$^-$_L, SB$^-$_M, and SB_U, the non-volatile memory 10 generates the compressed soft bit data SB$^-$OR. Based on the OR operation of the partial soft bit data SB$^+$_L, SB$^+$ M, and SB$^+$ U, the non-volatile memory 10 generates the compressed soft bit data SB⁺OR. The non-volatile memory 10 transmits the hard bit data HB_L, HB_M, and HB_U and the compressed soft bit data SB⁻OR and SB⁺OR to the memory controller 20. With this, the size of the data transmitted to the memory controller 20 in the soft determination decoding process can correspond to three pages of the hard bit data of and two pages of the compressed soft bit data. Thus, the size of the transmission data can be reduced by one page as compared to a case of directly transmitting the soft bit data SB_L, SB_M, and SB_U to the memory controller 20. That is, outputting the compressed soft bit data SB⁻OR and SB⁺OR of two pages according to the first embodiment is expected to improve the data transfer speed by 1.5 times as compared to outputting the soft bit data SB_L, SB_M, and SB_U of three pages. Accordingly, an increase in the data amount output from the non-volatile memory 10 to the memory controller 20 can be suppressed.

In addition, when generating the compressed soft bit data SB⁻OR and SB⁺OR, the non-volatile memory 10 performs the read processes page by page. More specifically, for example, the read processes R6, R6⁻, R6⁺, R4, R4⁻, and R4⁺ corresponding to the middle page are performed continuously with respect to the read processes R5, R5⁻, R5⁺ corresponding to the lower page. When performing the read processes page by page, by performing the operation process as shown in FIGS. 13, 14, and 15, it is possible to generate the compressed soft bit data SB⁻OR and SB⁺OR while outputting the hard bit data HB.

In addition, the SB decoder 47 performs the operation process described with reference to FIG. 10 with respect to the hard bit data HB_L, HB_M, and HB_U and the compressed soft bit data SB⁻OR and SB⁺OR. With this, the soft bit data SB_L, SB_M, and SB_U can be restored. Accordingly, the soft determination decoding circuit 33 can perform the soft determination decoding process.

2. Second Embodiment

Next, a memory system according to the second embodiment will be described. The second embodiment is different from the first embodiment in that read processes R1 to R7 are sequentially performed in the descending order of the read voltages. In the following description, arrangements and operations different from those in the first embodiment will be mainly described. A description of arrangements and operations similar to those in the first embodiment will be omitted as appropriate.

2.1 Command Sequence

Figure 16:
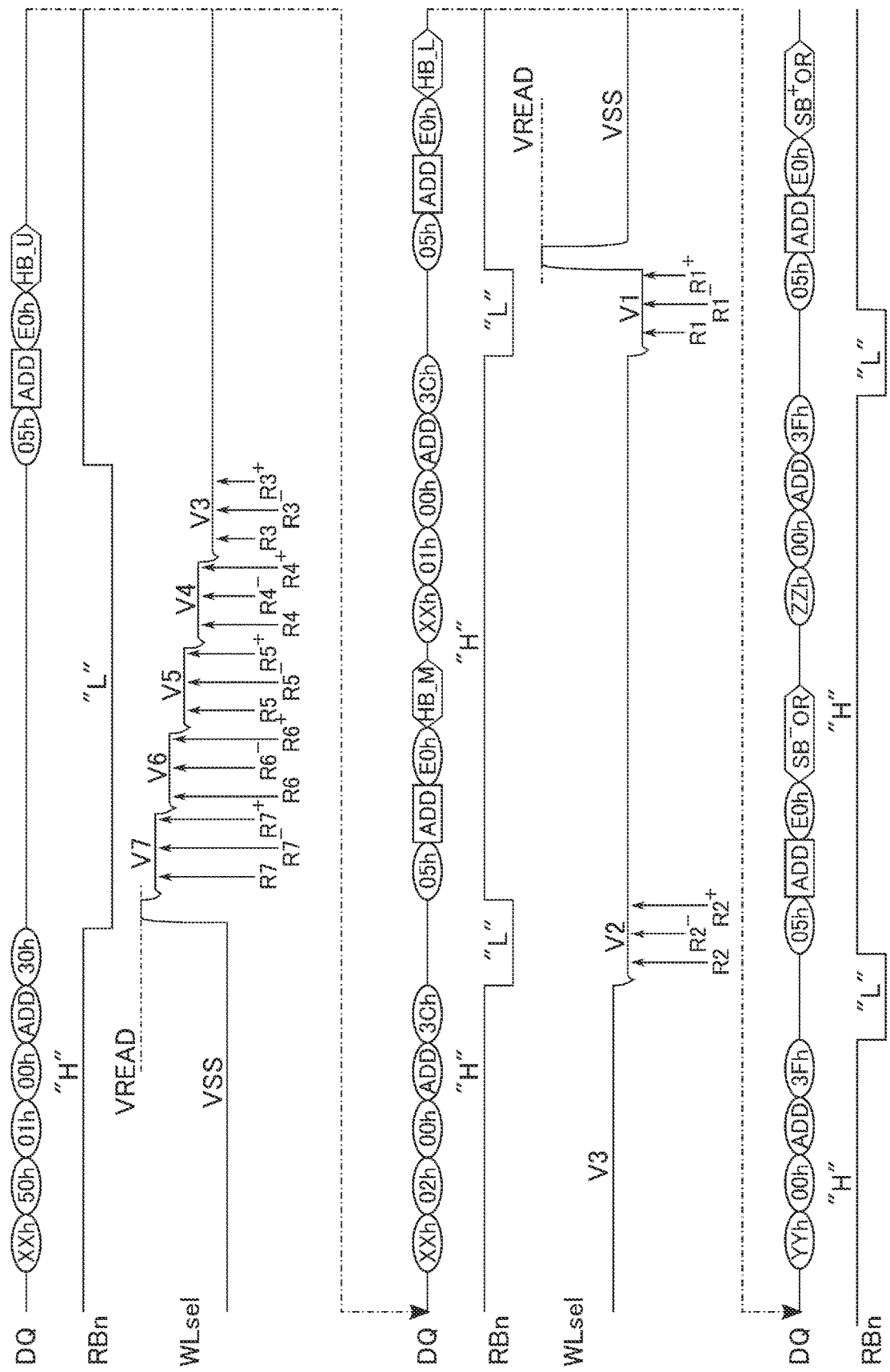
FIG. 16 is a command sequence showing an example of a series of processes including a soft determination decoding process in a memory system according to the second embodiment.

FIG. 16 is a command sequence showing an example of a series of processes including a soft determination decoding process in a memory system according to the second embodiment. FIG. 16 corresponds to FIG. 12 in the first embodiment.

A memory controller 20 transmits, to a non-volatile memory 10, a command "XXh", a command "50h", a command "01h", a command "00h", an address ADD, and a command "30h" in this order. A set of the commands "50h" and "01h" instructs to sequentially apply voltages.

If the command "30h" is received, the non-volatile memory 10 asserts a signal RBn from "H" level to "L" level to transition to the busy state, and starts sequential read processes. More specifically, a row decoder 18 applies a voltage VREAD to a selected word line WLsel, and then applies read voltages V7, V6, V5, V4, and V3 in this order.

While the read voltage V7 is being applied, a sense amplifier module 19 performs read processes R7, R7⁻, and R7⁺ in this order. While the read voltage V6 is being applied, the sense amplifier module 19 performs read processes R6, R6⁻, and R6⁺ in this order. While the read voltage V5 is being applied, the sense amplifier module 19 performs read processes R5, R5⁻, and R5⁺ in this order. While the read voltage V4 is being applied, the sense amplifier module 19 performs read processes R4, R4⁻, and R4⁺ in this order. While the read voltage V3 is being applied, the sense amplifier module 19 performs read processes R3, R3⁻, and R3⁺ in this order.

The sense amplifier module 19 performs an operation process based on the data read out by various read processes. With this, hard bit data HB_U is generated.

If the read process R3⁺ ends, the non-volatile memory 10 negates the signal RBn from "L" level to "H" level to transition to the ready state. Note that the read voltage V3 continues to be applied to the selected word line WLsel even after the transition to the ready state.

If the signal RBn at "H" level is received, the memory controller 20 transmits, to the non-volatile memory 10, a command "05h", the address ADD, and a command "E0h" in this order.

If the command "E0h" is received, the non-volatile memory 10 outputs the hard bit data HB_U to the memory controller 20.

If the hard bit data HB_U is received, the memory controller 20 transmits, to the non-volatile memory 10, the command "XXh", a command "02h", the command "00h", the address ADD, and a command "3Ch" in this order. The command "3Ch" is a command instructing to restart the sequential read processes.

If the command "3Ch" is received, the non-volatile memory 10 asserts the signal RBn from "H" level to "L" level to transition to the busy state, and restarts the sequential read processes. More specifically, the row decoder 18 applies a read voltage V2 to the selected word line WLsel.

While the read voltage V2 is being applied, the sense amplifier module 19 performs read processes R2, R2⁻, and R2⁺ in this order.

The sense amplifier module 19 performs an operation process based on the data read out by various read processes. With this, hard bit data HB_M is generated.

If the read process R2⁺ ends, the non-volatile memory 10 negates the signal RBn from "L" level to "H" level to transition to the ready state. Note that the read voltage V2 continues to be applied to the selected word line WLsel even after the transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the hard bit data HB_M to the memory controller 20.

If the hard bit data HB_M is received, the memory controller 20 transmits, to the non-volatile memory 10, the command "XXh", the command "01h", the command "00h", the address ADD, and the command "3Ch" in this order.

If the command "3Ch" is received, the non-volatile memory 10 asserts the signal RBn from "H" level to "L" level to transition to the busy state, and restarts the sequential read processes. More specifically, the row decoder 18 applies a read voltage V1 to the selected word line WLsel.

While the read voltage V1 is being applied, the sense amplifier module 19 performs read processes R1, R1⁻, and R1⁺ in this order.

The sense amplifier module 19 performs an operation process based on the data read out by various read processes. With this, hard bit data HB_L and compressed soft bit data SB⁻OR and SB⁺OR are generated. At this time, the hard bit data HB_L and the compressed soft bit data SB⁻OR and SB⁺OR are stored in latch circuits XDL, ADL, and BDL, respectively.

If the read process R1⁺ ends, the non-volatile memory 10 negates the signal RBn from "L" level to "H" level to transition to the ready state.

If the signal RBn at "H" level is received, the memory controller 20 transmits, to the non-volatile memory 10, the command "05h", the address ADD, and the command "E0h" in this order.

If the command "E0h" is received, the non-volatile memory 10 outputs the hard bit data HB_L to the memory controller 20.

If the hard bit data HB_L is received, the memory controller 20 causes the non-volatile memory 10 to transfer the compressed soft bit data SB⁻OR stored in the latch circuit ADL to the latch circuit XDL, and then output the compressed soft bit data SB⁻OR to the memory controller 20. In addition, the memory controller 20 causes the non-volatile memory 10 to transfer the compressed soft bit data SB⁺OR stored in the latch circuit BDL to the latch circuit XDL, and then output the compressed soft bit data SB⁺OR to the memory controller 20. The transfer process and output process of each of the compressed soft bit data SB⁻OR and SB⁺OR are similar to those in the first embodiment, and a description thereof will be omitted.

Thus, the command sequence showing an example of a series of processes including the soft determination decoding process ends.

2.2 Operation Process

Figure 17:
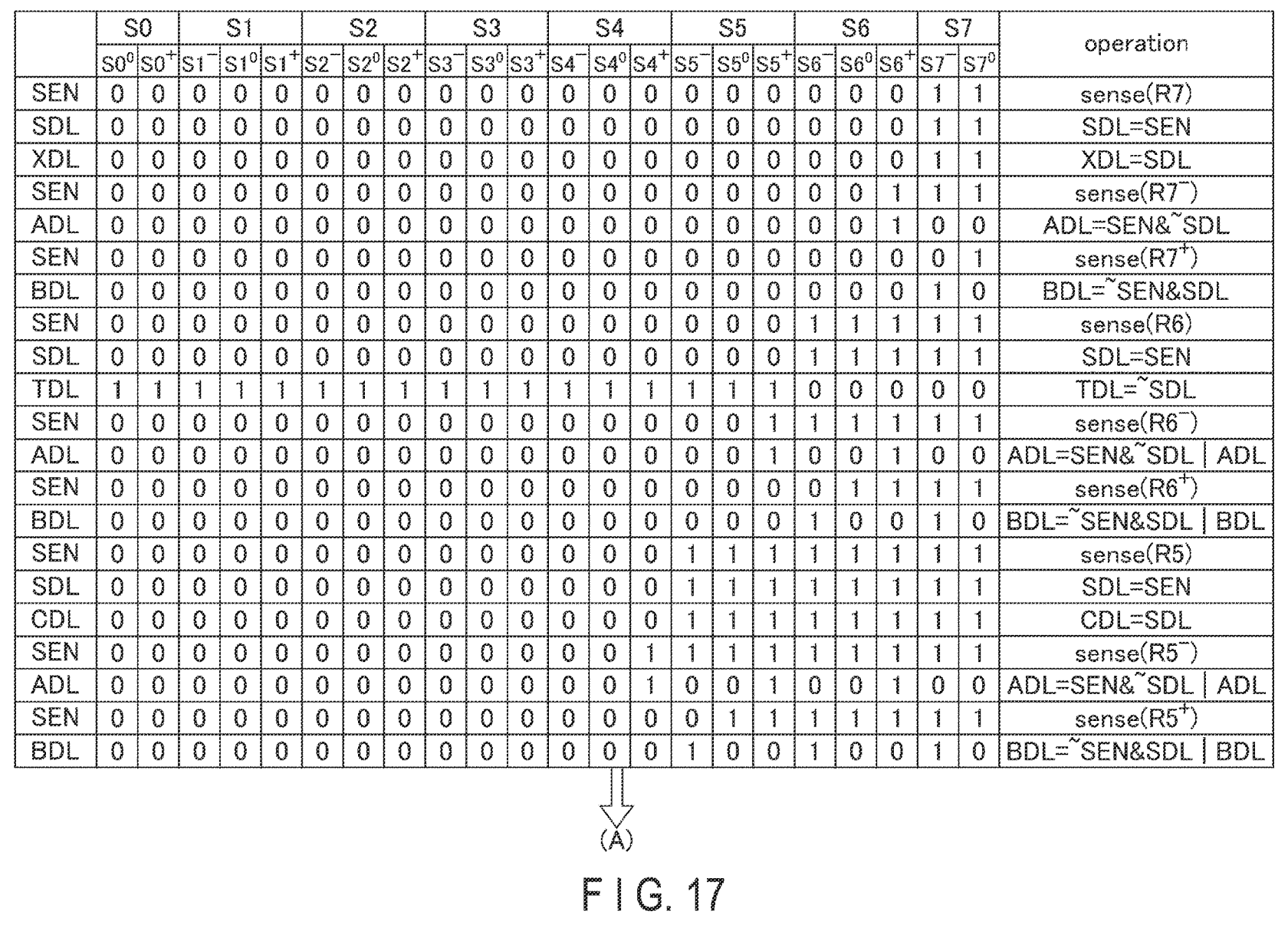
Figure 20:
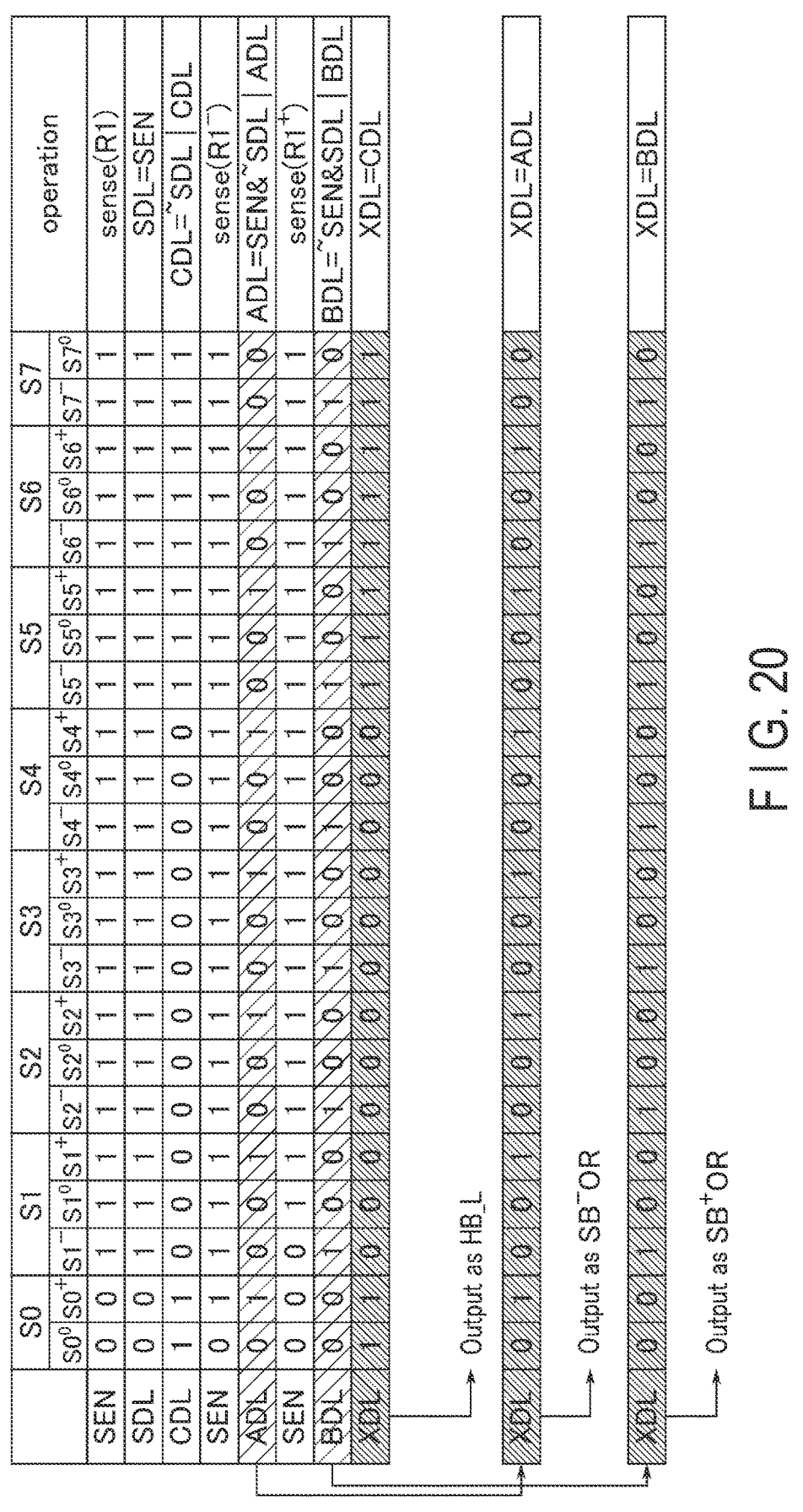

FIGS. 17, 18, 19, and 20 are views showing an example of the operation process in the non-volatile memory according to the second embodiment. FIGS. 17 and 18 show the operation process from generation of the hard bit data HB_U up to output of the hard bit data HB_U to the memory controller 20. FIG. 19 shows the operation process, after output of the hard bit data HB_U, from generation of the hard bit data HB_M up to output of the hard bit data HB_M to the memory controller 20. FIG. 20 shows the operation process, after output of the hard bit data HB_M, from generation of the hard bit data HB_L and the compressed soft bit data SB⁻OR and SB⁺OR up to output thereof to the memory controller 20.

With reference to FIGS. 17 and 18, the operation process concerning the hard bit data HB_U will be described.

First, the read process R7 is performed. With this, the page data which is "1" in the "S7" state and "0" in the other states is stored in a node SEN. This page data is transferred to a latch circuit SDL and the larch circuit XDL.

Then, the read process R7⁻ is performed. With this, the page data which is "1" in the "S6⁺" state and the "S7" state and "0" in the other states is stored in the node SEN. An operation unit OP executes (SEN&˜SDL), and stores the result in the latch circuit ADL. With this, the page data stored in the latch circuit ADL is "1" in the "S6⁺" state, and "0" in the other states.

Then, the read process R7⁺ is performed. With this, the page data which is "1" in the "S7⁰⁻" state and "0" in the other states is stored in the node SEN. The operation unit OP executes (˜SEN&SDL), and stores the result in the latch circuit BDL. With this, the page data stored in the latch circuit BDL is "1" in the "S7⁻" state, and "0" in the other states.

Then, the read process R6 is performed. With this, the page data which is "1" in the "S6" state and the "S7" state and "0" in the other states is stored in the node SEN. This page data is transferred to the latch circuit SDL. The operation unit OP executes (˜SDL), and stores the result in a latch circuit TDL. With this, the page data stored in the latch circuit TDL is "1" in the "S0" state to the "S5" state, and "0" in the other states.

Then, the read process R6⁻ is performed. With this, the page data which is "1" in the "S5⁺" state, the "S6" state, and the "S7" state and "0" in the other states is stored in the node SEN. The operation unit OP executes (SEN&˜SDL|ADL), and stores the result in the latch circuit ADL. With this, the page data stored in the latch circuit ADL is "1" in the "S5⁺" state and the "S6⁺" state, and "0" in the other states.

Then, the read process R6⁺ is performed. With this, the page data which is "1" in the "S60" state, the "S6⁺" state, and the "S7" state and "0" in the other states is stored in the node SEN. The operation unit OP executes (˜SEN&SDL|BDL), and stores the result in the latch circuit BDL. With this, the page data stored in the latch circuit BDL is "1" in the "S6⁻" state and the "S7⁻" state, and "0" in the other states.

Then, the read process R5 is performed. With this, the page data which is "1" in the "S5" state to the "S7" state and "0" in the other states is stored in the node SEN. This page data is transferred to the latch circuit SDL and a latch circuit CDL.

Then, the read process R5⁻ is performed. With this, the page data which is "1" in the "S4⁺" state and the "S5" state to the "S7" state and "0" in the other states is stored in the node SEN. The operation unit OP executes (SEN&˜SDL|ADL), and stores the result in the latch circuit ADL. With this, the page data stored in the latch circuit ADL is "1" in the "S4⁺" state, the "S5⁺" state, and the "S6⁺" state, and "0" in the other states.

Then, the read process R5⁺ is performed. With this, the page data which is "1" in the "S5⁰" state, the "S5⁺" state, the "S6" state, and the "S7" state and "0" in the other states is stored in the node SEN. The operation unit OP executes (˜SEN&SDL|BDL), and stores the result in the latch circuit BDL. With this, the page data stored in the latch circuit BDL is "1" in the "S5⁻" state, the "S6⁻" state, and the "S7⁻" state, and "0" in the other states.

Then, the read process R4 is performed. With this, the page data which is "1" in the "S4" state to the "S7" state and "0" in the other states is stored in the node SEN. This page data is transferred to the latch circuit SDL. The operation unit OP executes (SDL&TDL), and stores the result in the latch circuit TDL. With this, the page data stored in the latch circuit TDL is "1" in the "S4" state and the "S5" state, and "0" in the other states.

Then, the read process R4⁻ is performed. With this, the page data which is "1" in the "S3⁺" state and the "S4" state to the "S7" state and "0" in the other states is stored in the node SEN. The operation unit OP executes (SEN&˜SDL|ADL), and stores the result in the latch circuit ADL. With this, the page data stored in the latch circuit ADL is "1" in the "S3⁺" state, the "S4⁺" state, the "S5⁺" state, and the "S6⁺" state, and "0" in the other states.

Then, the read process R4⁺ is performed. With this, the page data which is "1" in the "S4⁰" state, the "S4⁺" state, and the "S5" state to the "S7" state and "0" in the other states is stored in the node SEN. The operation unit OP executes (~SEN&SDL|BDL), and stores the result in the latch circuit BDL. With this, the page data stored in the latch circuit BDL is "1" in the "S4$^-$" state, the "S5$^-$" state, the "S6$^-$" state, and the "S7$^-$" state, and "0" in the other states.

Then, the read process R3 is performed. With this, the page data which is "1" in the "S3" state to the "S7" state and "0" in the other states is stored in the node SEN. This page data is transferred to the latch circuit SDL. The operation unit OP executes (~SDL|XDL), and stores the result in the latch circuit XDL. With this, the hard bit data HB_U is stored in the latch circuit XDL.

Then, the read process R3$^-$ is performed. With this, the page data which is "1" in the "S2$^+$" state and the "S3" state to the "S7" state and "0" in the other states is stored in the node SEN. The operation unit OP executes (SEN&~SDL|ADL), and stores the result in the latch circuit ADL. With this, the page data stored in the latch circuit ADL is "1" in the "S2$^+$" state, the "S3$^+$" state, the "S4$^+$" state, the "S5$^+$" state, and the "S6$^+$" state, and "0" in the other states.

Then, the read process R3$^+$ is performed. With this, the page data which is "1" in the "S3$^0$" state, the "S3$^+$" state, and the "S4" state to the "S7" state and "0" in the other states is stored in the node SEN. The operation unit OP executes (~SEN&SDL|BDL), and stores the result in the latch circuit BDL. With this, the page data stored in the latch circuit BDL is "1" in the "S3$^-$" state, the "S4$^-$" state, the "S5$^-$" state, the "S6$^-$" state, and the "S7$^-$" state, and "0" in the other states.

If the read process R3$^+$ ends, the non-volatile memory 10 outputs the hard bit data HB_U to the memory controller 20. Note that the data stored in the latch circuits ADL and BDL are maintained in the subsequent processes to generate the compressed soft bit data SB$^-$OR and SB$^+$OR.

Next, with reference to FIG. 19, the operation process concerning the hard bit data HB_M will be described.

First, the read process R2 is performed. With this, the page data which is "1" in the "S2" state to the "S7" state and "0" in the other states is stored in the node SEN. This page data is transferred to the latch circuit SDL. The operation unit OP executes (SDL|TDL), and stores the result in the latch circuit TDL. With this, the hard bit data HB_M is stored in the latch circuit TDL.

Then, the read process R2$^-$ is performed. With this, the page data which is "1" in the "S1$^+$" state and the "S2" state to the "S7" state and "0" in the other states is stored in the node SEN. The operation unit OP executes (SEN&~SDL|ADL), and stores the result in the latch circuit ADL. With this, the page data stored in the latch circuit ADL is "1" in the "S1$^+$" state, the "S2$^+$" state, the "S3$^+$" state, the "S4$^+$" state, the "S5$^+$" state, and the "S6$^+$" state, and "0" in the other states.

Then, the read process R2$^+$ is performed. With this, the page data which is "1" in the "S2$^0$" state, the "S2$^+$" state, and the "S4" state to the "S7" state and "0" in the other states is stored in the node SEN. The operation unit OP executes (~SEN&SDL|BDL), and stores the result in the latch circuit BDL. With this, the page data stored in the latch circuit BDL is "1" in the "S2$^-$" state, the "S3$^-$" state, the "S4$^-$" state, the "S5$^-$" state, the "S6$^-$" state, and the "S7$^-$" state, and "0" in the other states.

If the read process R2$^+$ ends, the hard bit data HB_M stored in the latch circuit TDL is transferred to the latch circuit XDL. With this, the non-volatile memory 10 can output the hard bit data HB_M to the memory controller 20. Note that the data stored in the latch circuits ADL and BDL are maintained in the subsequent processes to generate the compressed soft bit data SB$^-$OR and SB$^+$OR.

Next, with reference to FIG. 20, the operation process concerning the hard bit data HB_L will be described.

First, the read process R1 is performed. With this, the page data which is "1" in the "S1" state to the "S7" state and "0" in the other states is stored in the node SEN. This page data is transferred to the latch circuit SDL. The operation unit OP executes (~SDL|CDL), and stores the result in the latch circuit CDL. With this, the hard bit data HB_L is stored in the latch circuit CDL.

Then, the read process R1$^-$ is performed. With this, the page data which is "1" in the "S0$^+$" state and the "S1" state to the "S7" state and "0" in the other states is stored in the node SEN. The operation unit OP executes (SEN&~SDL|ADL), and stores the result in the latch circuit ADL. With this, the compressed soft bit data SB$^-$OR is stored in the latch circuit ADL.

Then, the read process R1$^+$ is performed. With this, the page data which is "1" in the "S1$^0$" state, the "S1$^+$" state, and the "S2" state to the "S7" state and "0" in the other states is stored in the node SEN. The operation unit OP executes (~SEN&SDL|BDL), and stores the result in the latch circuit BDL. With this, the compressed soft bit data SB$^+$OR is stored in the latch circuit BDL.

If the read process R1$^+$ ends, the hard bit data HB_L stored in the latch circuit CDL is transferred to the latch circuit XDL. With this, the non-volatile memory 10 can output the hard bit data HB_L to the memory controller 20.

If output of the hard bit data HB_L ends, the compressed soft bit data SB$^-$OR stored in the latch circuit ADL is transferred to the latch circuit XDL. With this, the non-volatile memory 10 can output the compressed soft bit data SB$^-$OR to the memory controller 20.

If output of the compressed soft bit data SB$^-$OR ends, the compressed soft bit data SB$^+$OR stored in the latch circuit BDL is transferred to the latch circuit XDL. With this, the non-volatile memory 10 can output the compressed soft bit data SB$^+$OR to the memory controller 20.

2.3 Effect According to Second Embodiment

According to the second embodiment, when generating the compressed soft bit data SB$^-$OR and SB$^+$OR, the non-volatile memory 10 sequentially performs the read processes in the descending order of the read voltages. More specifically, for example, the read processes R5, R5$^-$, and R5$^+$ corresponding to the lower page are performed between the read processes R6, R6$^-$, and R6$^+$ and the read processes R4, R4, and R4$^+$, which correspond to the middle page. When performing the sequential read processes as described above, by performing the operation process as shown in FIGS. 17, 18, 19, and 20, it is possible to generate the compressed soft bit data SB$^-$OR and SB$^+$OR while outputting the hard bit data HB.

3. Modification

Various modifications can be applied to the first embodiment and the second embodiment described above.

In the first embodiment and the second embodiment described above, the case has been described in which data of three pages are stored in the cell unit CU, but the embodiments are not limited to this. For example, also in a case in which data of four pages are stored in the cell unit CU, the restoring process based of the compressed soft bit data SB$^-$OR and SB$^+$OR of two pages can be performed.

In the following description, arrangements and operations different from those in the first embodiment and the second embodiment will be mainly described. A description of arrangements and operations similar to those in the first embodiment and the second embodiment will be omitted as appropriate.

3.1 SB Recovery Circuit

The write mode to store 4-bit data in the memory cell transistor MT is also called a QLC (Quadrable Level Cell) mode. The bits of 4-bit data written and stored in the memory cell transistor in the QLC mode are referred to as a lower bit, a middle bit, an upper bit, and a top bit in the order from the lower bit. A set of the lower bits, a set of the middle bits, a set of the upper bits, and a set of the top bits stored in the memory cell transistors MT included in the same cell unit CU are referred to as a "lower page", a "middle page", an "upper page", and a "top page", respectively.

Figure 21:
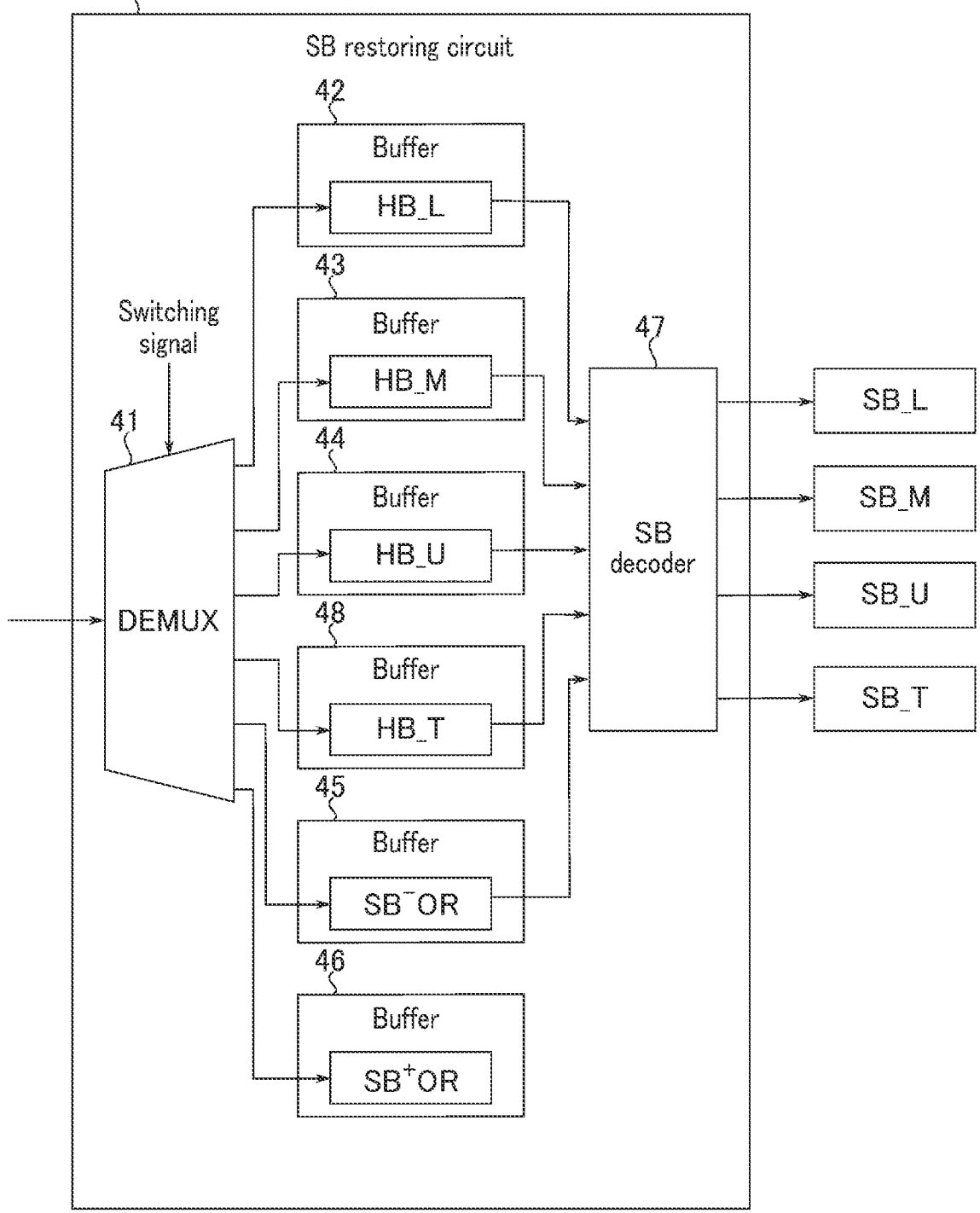
FIG. 21 is a block diagram showing an example of the arrangement of an SB restoring circuit according to a modification.

FIG. 21 is a block diagram showing an example of the arrangement of an SB restoring circuit according to a modification. FIG. 21 corresponds to FIG. 8 in the first embodiment.

An SB restoring circuit 34A according to the modification further includes a buffer 48 in addition to the DEMUX 41, the five buffers 42 to 46, and the SB decoder 47.

The DEMUX 41 electrically connects the input terminal and one of five output terminals connected to the buffers 42 to 46 and 48, respectively, based on a switching signal from the control circuit 21.

The buffer 42 is a buffer that temporarily stores the hard bit data HB_L corresponding to the lower page. The buffer 43 is a buffer that temporarily stores the hard bit data HB_M corresponding to the middle page. The buffer 44 is a buffer that temporarily stores the hard bit data HB_U corresponding to the upper page. The buffer 48 is a buffer that temporarily stores hard bit data HB_T corresponding to the top page.

The buffer 45 is a buffer that temporarily stores the compressed soft bit data SB$^-$OR. The buffer 46 is a buffer that temporarily stores the compressed soft bit data SB$^+$OR.

The SB decoder 47 is a restoring circuit of the soft bit data SB. The SB decoder 47 receives the hard bit data HB_L, HB_M, HB_U, and HB_T, and the compressed soft bit data SB$^-$OR and SB$^+$OR. Based on the hard bit data HB_L, HB_M, HB_U, and HB_T, and the compressed soft bit data SB$^-$OR and SB$^+$OR, the SB decoder 47 restores the soft bit data SB_L corresponding to the lower page, the soft bit data SB_M corresponding to the middle page, the soft bit data SB_U corresponding to the upper page, and the soft bit data SB_T corresponding to the top page. For example, the SB decoder 47 transmits the soft bit data SB_L, SB_M, SB_U, and SB_T to the soft determination decoding circuit 33.

3.2 Hard Bit Data and Soft Bit Data

In a case in which the memory cell transistor MT stores 4-bit data, the threshold voltage distribution thereof is divided into 16 distributions. The 16 threshold voltage distributions are referred to as the "S0" state to the "S15" state in the ascending order of the threshold voltages.

Figure 22:
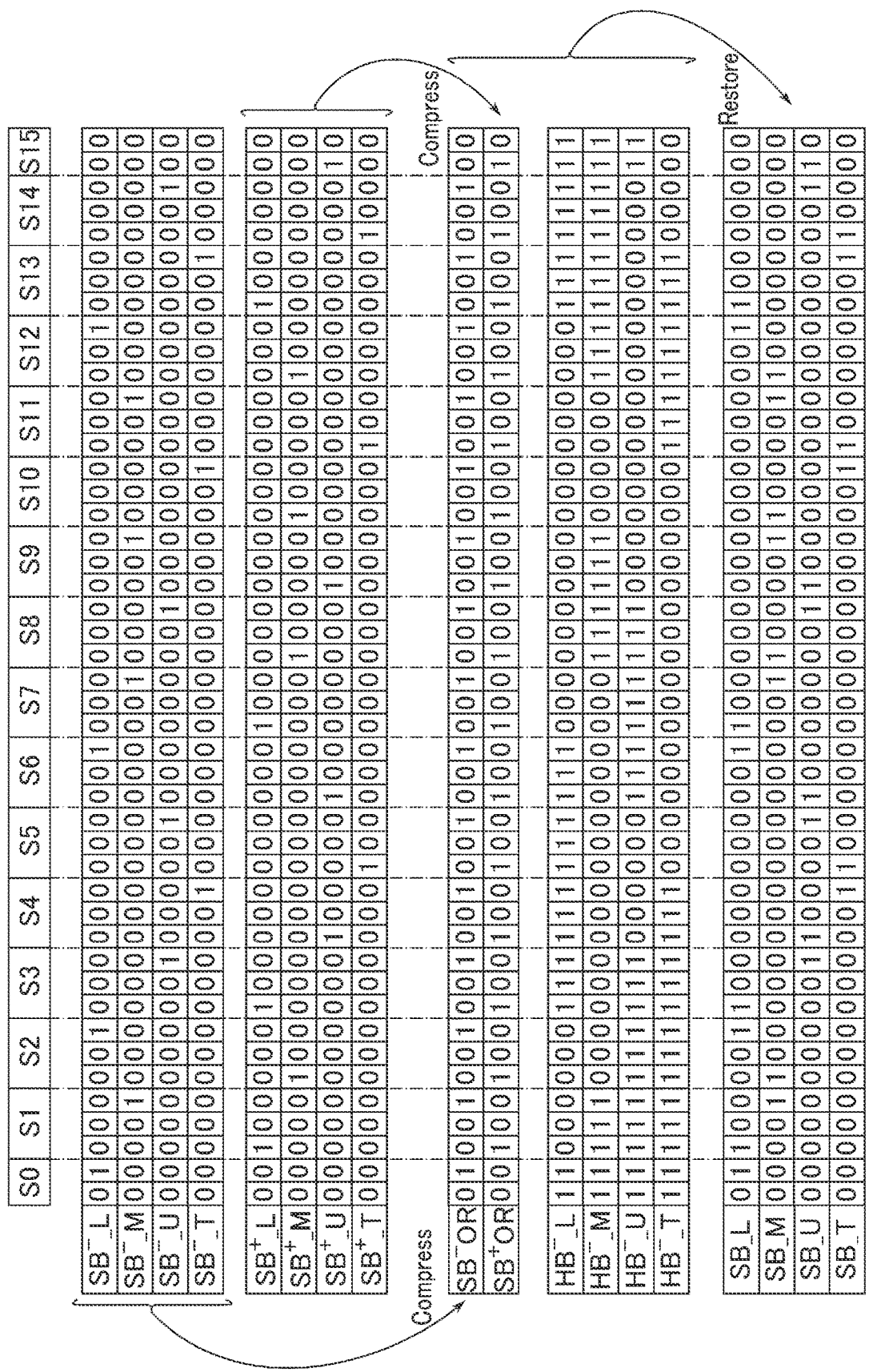
FIG. 22 is a view showing an example of the relationship among partial soft bit data, compressed soft bit data, and soft bit data in the memory system according to the modification.

FIG. 22 is a view showing an example of the relationship among the partial soft bit data, the compressed soft bit data, and the soft bit data in the memory system according to the modification. FIG. 22 corresponds to FIG. 10 in the first embodiment. FIG. 22 shows a case in which each of the "S0" state and the "S15" state is further classified into two states, and each of the "S1" state to the "S14" state is further classified into three states. Although not shown in FIG. 22, the two states in the "S0" state are the "S0$^0$" state and the "S0$^+$" state from the lower voltage side. The three states in the "Sj" state are the "Sj$^-$" state, the "Sj$^0$" state, and the "Sj$^+$" state from the lower voltage side (1≤j≤14). The two states in the "S15" state are the "S15$^-$" state and the "S15$^0$" state from the lower voltage side.

As shown in FIG. 22, the non-volatile memory 10 generates the hard bit data HB_L and partial soft bit data SB$^-$_L and SB$^+$_L corresponding to the lower page, the hard bit data HB_M and partial soft bit data SB$^-$_M and SB$^+$ M corresponding to the middle page, the hard bit data HB_U and partial soft bit data SB$^-$_U and SB$^+$ U corresponding to the upper page, and the hard bit data HB_T and partial soft bit data SB$^-$_T and SB$^+$_T corresponding to the top page.

The partial soft bit data SB$^-$_L is "1" in the "S0$^+$" state, the "S2$^+$" state, the "S6$^+$" state, and the "S12$^+$" state, and "0" in the other states. The partial soft bit data SB$^-$_M is "1" in the "S1$^+$" state, the "S7$^+$" state, the "S9$^+$" state, and the "S11$^+$" state, and "0" in the other states. The partial soft bit data SB$^-$_U is "1" in the "S3$^+$" state, the "S5$^+$" state, the "S8$^+$" state, and the "S14$^+$" state, and "0" in the other states. The partial soft bit data SB$^-$_T is "1" in the "S4$^+$" state, the "S10$^+$" state, and the "S13$^+$" state, and "0" in the other states. In this manner, the partial soft bit data SB$^-$_L, SB$^-$_M, SB$^-$_U, and SB$^-$_T are "1" in the states that do not overlap each other.

The non-volatile memory 10 generates the compressed soft bit data SB$^-$OR by executing an OR operation of the partial soft bit data SB$^-$_L, SB$^-$_M, SB$^-$_U, and SB$^-$_T. Therefore, the compressed soft bit data SB$^-$OR is "1" in the "S0$^+$" state, the "S1$^+$" state, the "S2$^+$" state, the "S3$^+$" state, the "S4$^+$" state, the "S5$^+$" state, the "S6$^+$" state, the "S7$^+$" state, the "S8$^+$" state, the "S9$^+$" state, the "S10$^+$" state, the "S11$^+$" state, the "S12$^+$" state, the "S13$^+$" state, and the "S14$^+$" state, and "0" in the other states.

The partial soft bit data SB$^+$_L is "1" in the "S1$^-$" state, the "S3$^-$" state, the "S7$^-$" state, and the "S13$^-$" state, and "0" in the other states. The partial soft bit data SB$^+$ M is "1" in the "S2$^-$" state, the "S8$^-$" state, the "S10$^-$" state, and the "S12$^-$" state, and "0" in the other states. The partial soft bit data SB$^+$ U is "1" in the "S4$^-$" state the "S6$^-$" state, the "S9$^-$" state, and the "S15$^-$" state, and "0" in the other states. The partial soft bit data SB$^+$_T is "1" in the "S5$^-$" state the "S11$^-$" state, and the "S14$^-$" state, and "0" in the other states. In this manner, the partial soft bit data SB$^+$_L, SB$^+$ M, SB$^+$ U, and SB$^+$_T are "1" in the states that do not overlap each other.

The non-volatile memory 10 generates the compressed soft bit data SB$^+$OR by executing an OR operation of the partial soft bit data SB$^+$_L, SB$^+$ M, SB$^+$ U, and SB$^+$_T. Therefore, the compressed soft bit data SB$^+$OR is "1" in the "S1$^-$" state, the "S2$^-$" state, the "S3$^-$" state, the "S4$^-$" state, the "S5$^-$" state, the "S6$^-$" state, the "S7$^-$" state, the "S8$^-$" state, the "S9$^-$" state, the "S10$^-$" state, the "S11$^-$" state, the "S12$^-$" state, the "S13$^-$" state, the "S14$^-$" state, and the "S15$^-$" state, and "0" in the other states.

The non-volatile memory 10 outputs, to the memory controller 20, the compressed soft bit data SB$^-$OR and SB$^+$OR of two pages generated by the above-described operation process and the hard bit data HB_L, HB_M, HB_U, and HB_T of four pages.

Based on the compressed soft bit data SB$^-$OR and SB$^+$OR of two pages and the hard bit data HB_L, HB_M, HB_U, and HB_T of four pages, the SB decoder 47 generates the soft bit data SB_L, SB_M, SB_U, and SB_T of four pages.

The soft bit data SB_L corresponding to the lower page is "1" in the "S0$^{+}$" state, the "S1$^{-}$" state, the "S2$^{+}$" state, and the "S3$^{-}$" state, the "S6$^{+}$" state, the "S7$^{-}$" state, the "S12$^{+}$" state, and the "S13$^{-}$" state, and "0" in the other states. The SB decoder 47 generates the soft bit data SB_L by, for example, the following operations.

SB_L =

$(X0 | X2 | X6 | X12) \& SB-OR) | (X1 | X3 | X7 | X13) \& SB^+OR)$ $X0 = HB\_L \& HB\_M \& HB\_U \& HB\_T$ $X1 = \sim HB\_L \& HB\_M \& HB\_U \& HB\_T$ $X2 = \sim HB\_L \& \sim HB\_M \& HB\_U \& HB\_T$ $X3 = HB\_L \& \sim HB\_M \& HB\_U \& HB\_T$ $X6 = HB\_L \& \sim HB\_M \& HB\_U \& \sim HB\_T$ $X7 = \sim HB\_L \& \sim HB\_M \& HB\_U \& \sim HB\_T$ $X12 = \sim HB\_L \& HB\_M \& \sim HB\_U \& HB\_T$ $X13 = HB\_L \& HB\_M \& \sim HB\_U \& HB\_T$ The soft bit data SB_M corresponding to the middle page is "1" in the "S1$^{+}$" state, the "S2$^{-}$" state, the "S7$^{+}$" state, the "S8$^{-}$" state, the "S9$^{+}$" state, the "S10$^{-}$" state, the "S11$^{+}$" state, and the "S12$^{-}$" state, and "0" in the other states. The SB decoder 47 generates the soft bit data SB_M by, for example, the following operations.

SB_M =

$(X1 | X7 | X9 | X11) \& SB-OR) | (X2 | X8 | X10 | X12) \& SB^+OR)$ $X8 = \sim HB\_L \& HB\_M \& HB\_U \& \sim HB\_T$ $X9 = \sim HB\_L \& HB\_M \& \sim HB\_U \& \sim HB\_T$ $X10 = \sim HB\_L \& \sim HB\_M \& \sim HB\_U \& \sim HB\_T$ $X11 = \sim HB\_L \& \sim HB\_M \& \sim HB\_U \& HB\_T$ The soft bit data SB_U corresponding to the upper page is "1" in the "S3$^{+}$" state, the "S4$^{-}$" state, the "S5$^{+}$" state, the "S6$^{-}$" state, the "S8$^{+}$" state, the "S9$^{-}$" state, the "S14$^{+}$" state, and the "S15$^{-}$" state, and "0" in the other states. The SB decoder 47 generates the soft bit data SB_U by, for example, the following operations.

SB_U =

$(X3 | X5 | X8 | X14) \& SB-OR) | (X4 | X6 | X9 | X15) \& SB^+OR)$ $X4 = HB\_L \& \sim HB\_M \& \sim HB\_U \& HB\_T$ $X5 = HB\_L \& \sim HB\_M \& \sim HB\_U \& \sim HB\_T$ $X14 = HB\_L \& HB\_M \& \sim HB\_U \& \sim HB\_T$ $X15 = HB\_L \& HB\_M \& HB\_U \& \sim HB\_T$ In this manner, the non-volatile memory 10 compresses the partial soft bit data SB$^-$_L, SB$^-$_M, SB$^-$_U, SB$^-$_T, SB$^+$_L, SB$^+$ M, SB$^+$ U, and SB$^+$_T of eight pages into the compressed soft bit data SB$^-$OR and SB$^+$OR of two pages.

Based on the hard bit data HB_L, HB_M, HB_U, and HB_T of four pages and the compressed soft bit data SB$^-$OR and SB$^+$OR of two pages, the SB decoder 47 restores the soft bit data SB_L, SB_M, SB_U, and SB_T of four pages.

3.3 Effect According to Modification

According to the modification, the non-volatile memory 10 reads out the hard bit data HB_L, HB_M, HB_U, HB_T and the partial soft bit data SB$^-$_L, SB$^+$_L, SB$^-$_M, SB$^+$ M, SB$^-$_U, SB$^+$ U, SB$^-$_T, and SB$^+$_T from the target cell unit CU. Based on the OR operation of the partial soft bit data SB$^-$_L, SB$^-$_M, SB$^-$_U, and SB$^-$_T, the non-volatile memory 10 generates the compressed soft bit data SB$^-$OR. Based on the OR operation of the partial soft bit data SB$^+$_L, SB$^+$ M, SB$^+$ U, and SB$^+$_T, the non-volatile memory 10 generates the compressed soft bit data SB$^+$OR. The non-volatile memory 10 transmits the hard bit data HB_L, HB_M, HB_U, and HB_T and the compressed soft bit data SB$^-$OR and SB$^+$OR to the memory controller 20. With this, the size of the data transmitted to the memory controller 20 in the soft determination decoding process can correspond to four pages of the hard bit data and two pages of the compressed soft bit data. Thus, the size of the transmitted data can be reduced by two pages as compared to a case of directly transmitting the soft bit data SB_L, SB_M, SB_U, and SB_T to the memory controller 20. That is, outputting the compressed soft bit data SB$^-$OR and SB$^+$OR of two pages based on the modification is expected to improve the data transfer speed by two times as compared to outputting the soft bit data SB_L, SB_M, SB_U, and SB_T of four pages. In this manner, in spite of an increase in the number of bits stored in the memory cell transistor MT, the size of the compressed soft bit data can be suppressed to two pages. Accordingly, an increase in the data amount output from the non-volatile memory 10 to the memory controller 20 can be suppressed.

In addition, the SB decoder 47 performs the operation process described with reference to FIG. 22 on the hard bit data HB_L, HB_M, HB_U, and HB_T and the compressed soft bit data SB$^-$OR and SB$^+$OR. With this, the soft bit data SB_L, SB_M, SB_U, and SB_T can be restored. Accordingly, the soft determination decoding circuit 33 can perform the soft determination decoding process.

4. Others

The embodiments are not limited to the examples described in the first embodiment, the second embodiment, and the modification described above. Also in a case in which data of five or more pages are stored in the cell unit CU, the restoring process based on the compressed soft bit data SB$^-$OR and SB$^+$OR of two pages can also be performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A non-volatile memory comprising
a plurality of memory cells each configured to store a first bit and a second bit; and
a control circuit,
wherein the control circuit is configured to
read out first hard bit data, first partial soft bit data, and second partial soft bit data, each corresponding to the first bit, from the plurality of memory cells,
read out second hard bit data, third partial soft bit data, and fourth partial soft bit data, each corresponding to the second bit, from the plurality of memory cells,
generate first compressed soft bit data based on an OR operation of the first partial soft bit data and the third partial soft bit data,
generate second compressed soft bit data based on an OR operation of the second partial soft bit data and the fourth partial soft bit data, and
transmit the first hard bit data, the second hard bit data, the first compressed soft bit data, and the second compressed soft bit data to an external memory controller.

2. The memory according to claim 1, wherein
the control circuit is configured to transmit the first hard bit data, the second hard bit data, the first compressed soft bit data, and the second compressed soft bit data in accordance with a command from the memory controller.

3. The memory according to claim 2, wherein
a size of the compressed soft bit data transmitted to the memory controller in accordance with the command does not depend on the number of bits stored in the plurality of memory cells.

4. The memory according to claim 2, wherein
a size of the hard bit data transmitted to the memory controller in accordance with the command correlates with the number of bits stored in the plurality of memory cells.

5. The memory according to claim 1, wherein
the plurality of memory cells are configured to further store a third bit, and
the control circuit is configured to
read out third hard bit data, fifth partial soft bit data, and sixth partial soft bit data, each corresponding to the third bit, from the plurality of memory cells,
generate the first compressed soft bit data based on an OR operation of the first partial soft bit data, the third partial soft bit data, and the fifth partial soft bit data,
generate the second compressed soft bit data based on an OR operation of the second partial soft bit data, the fourth partial soft bit data, and the sixth partial soft bit data, and
transmit, to the memory controller, the first hard bit data, the second hard bit data, the third hard bit data, the first compressed soft bit data, and the second compressed soft bit data.

6. The memory according to claim 5, wherein
the plurality of memory cells are configured to further store a fourth bit, and
the control circuit is configured to
read out fourth hard bit data, seventh partial soft bit data, and eighth partial soft bit data, each corresponding to the fourth bit, from the plurality of memory cells,
generate the first compressed soft bit data based on an OR operation of the first partial soft bit data, the third partial soft bit data, the fifth partial soft bit data, and the seventh partial soft bit data,
generate the second compressed soft bit data based on an OR operation of the second partial soft bit data, the fourth partial soft bit data, the sixth partial soft bit data, and the eighth partial soft bit data, and
transmit, to the memory controller, the first hard bit data, the second hard bit data, the third hard bit data, the fourth hard bit data, the first compressed soft bit data, and the second compressed soft bit data.

7. The memory according to claim 1, wherein
the control circuit is configured to
read out the first hard bit data, first data, and second data from the plurality of memory cells based on a first read process using a first voltage,
generate the first partial soft bit data based on the first hard bit data and the first data, and
generate the second partial soft bit data based on the first hard bit data and the second data, and
a sense period corresponding to the first hard bit data is longer than a sense period corresponding to the first data, and shorter than a sense period corresponding to the second data.

8. The memory according to claim 7, wherein
the control circuit is configured to
read out the second hard bit data, third data, and fourth data from the plurality of memory cells based on a second read process using a second voltage and a third read process using a third voltage,
generate the third partial soft bit data based on the second hard bit data and the third data, and
generate the fourth partial soft bit data based on the second hard bit data and the fourth data, and
a sense period corresponding to the second hard bit data is longer than a sense period corresponding to the third data, and shorter than a sense period corresponding to the fourth data.

9. The memory according to claim 8, wherein
the control circuit is configured to perform the first read process between the second read process and the third read process.

10. The memory according to claim 8, wherein
the control circuit is configured to perform the second read process and the third read process continuously with respect to the first read process.

11. A memory system comprising:
a non-volatile memory including a plurality of memory cells each configured to store a first bit and a second bit; and
a memory controller configured to cause the non-volatile memory to perform a first operation,
wherein the non-volatile memory is configured to, in the first operation,
read out first hard bit data, first partial soft bit data, and second partial soft bit data, each corresponding to the first bit, from the plurality of memory cells,
read out second hard bit data, third partial soft bit data, and fourth partial soft bit data, each corresponding to the second bit, from the plurality of memory cells,
generate first compressed soft bit data based on an OR operation of the first partial soft bit data and the third partial soft bit data, and
generate second compressed soft bit data based on an OR operation of the second partial soft bit data and the fourth partial soft bit data, and the memory controller is configured to
restore first soft bit data and second soft bit data based on the first hard bit data, the second hard bit data, the first compressed soft bit data, and the second compressed soft bit data.

12. The system according to claim 11, wherein
the memory controller is configured to perform a soft determination decoding process based on the first soft bit data and the second soft bit data.

13. The system according to claim 11, wherein
the first soft bit data corresponds to an OR operation of the first partial soft bit data and the second partial soft bit data, and
the second soft bit data corresponds to an OR operation of the third partial soft bit data and the fourth partial soft bit data.

14. The system according to claim 11, wherein
the non-volatile memory is configured to perform the first operation in accordance with a command from the memory controller.

15. The system according to claim 14, wherein
a size of the compressed soft bit data transmitted to the memory controller in accordance with the command does not depend on the number of bits stored in the plurality of memory cells.

16. The system according to claim 14, wherein
a size of the hard bit data transmitted to the memory controller in accordance with the command correlates with the number of bits stored in the plurality of memory cells.

17. The system according to claim 11, wherein
the non-volatile memory is configured to, in the first operation,
read out, from the plurality of memory cells, the first hard bit data, first data, and second data based on a first read process using a first voltage,
generate the first partial soft bit data based on the first hard bit data and the first data, and
generate the second partial soft bit data based on the first hard bit data and the second data, and
a sense period corresponding to the first hard bit data is longer than a sense period corresponding to the first data, and shorter than a sense period corresponding to the second data.

18. The system according to claim 17, wherein
the non-volatile memory is configured to, in the first operation,
read out, from the plurality of memory cells, the second hard bit data, third data, and fourth data based on a second read process using a second voltage and a third read process using a third voltage,
generate the third partial soft bit data based on the second hard bit data and the third data, and
generate the fourth partial soft bit data based on the second hard bit data and the fourth data, and
a sense period corresponding to the second hard bit data is longer than a sense period corresponding to the third data, and shorter than a sense period corresponding to the fourth data.

19. The system according to claim 18, wherein
the non-volatile memory is configured to perform the first read process between the second read process and the third read process.

20. The system according to claim 18, wherein
the non-volatile memory is configured to perform the second read process and the third read process continuously with respect to the first read process.

* * * * *